United States Patent [19]
Itoh et al.

[11] Patent Number: 5,761,100
[45] Date of Patent: Jun. 2, 1998

[54] PERIOD GENERATOR FOR SEMICONDUCTOR TESTING APPARATUS

[75] Inventors: Masayuki Itoh; Yasutaka Tsuruki, both of Kazo, Japan

[73] Assignee: Advantest Corporation, Tokyo, Japan

[21] Appl. No.: 750,507

[22] PCT Filed: Apr. 13, 1995

[86] PCT No.: PCT/JP95/00722

§ 371 Date: Dec. 11, 1996

§ 102(e) Date: Dec. 11, 1996

[87] PCT Pub. No.: WO96/32654

PCT Pub. Date: Oct. 17, 1996

[30] Foreign Application Priority Data

Nov. 1, 1993 [JP] Japan ................... 5-63421

[51] Int. Cl.$^6$ ............................................. G06F 1/02
[52] U.S. Cl. ................ 364/718.01; 368/120; 395/555
[58] Field of Search ................ 364/718.01, 724.01, 364/934, 934.1, 934.3; 395/551, 555, 558; 327/141; 368/118, 119, 120

[56] References Cited

U.S. PATENT DOCUMENTS

| | | | |
|---|---|---|---|
| 4,074,514 | 2/1978 | Vaucher | 327/141 |
| 4,231,104 | 10/1980 | St. Clair | 395/555 |
| 4,657,406 | 4/1987 | Yaeda | 368/120 |
| 5,274,796 | 12/1993 | Conney | 395/551 |
| 5,459,419 | 10/1995 | Hatakenaka | 327/141 |
| 5,592,659 | 1/1997 | Toyama et al. | 345/558 |

FOREIGN PATENT DOCUMENTS

| | | |
|---|---|---|
| 62-12880 | 1/1987 | Japan. |
| 62-23495 | 5/1987 | Japan. |
| 6-103832 | 12/1994 | Japan. |

*Primary Examiner*—Reba I. Elmore
*Assistant Examiner*—Emmanuel L. Moise
*Attorney, Agent, or Firm*—Staas & Halsey

[57] ABSTRACT

The present invention makes possible to generate pulses having set period in high speed. An address series from a pattern generator 11 is converted into two address series, each having two time enabling periods by conversion means 40. A period value memory is read out by these two series of address series. A first and a second fractions read out are stored in flip-flops (FF hereinafter) $41_1$ and $41_2$ respectively, and integers are stored in FF $43_1$ and $43_2$ respectively. The output of the FF $41_2$ is stored in a FF $46_2$. The outputs of the FFs $41_1$ and $41_2$ are summed and accumulated in an adder $45_1$ and the outputs of the FFs $41_1$ and $46_2$ are summed and accumulated in an adder $45_2$. The outputs of the FFs $43_1$ and $43_2$ are set in coincidence detection counters $62_1$ and $62_2$ via FFs $58_1$ and $58_2$ respectively. Each of the counters $62_1$ and $62_2$ counts the clock and then outputs a signal when the count value coincides with the set value. The output signals are supplied to delay circuits $64_1$ and $64_2$ respectively. If a carry output from each of the adders $45_1$ and $45_2$ exists, each of the respective outputs from the delay circuits is delayed by one clock, and if a carry output does not exist, each of the respective outputs is outputted without delay.

8 Claims, 14 Drawing Sheets

PERIOD GENERATOR FOR SEMICONDUCTOR TESTING APPARATUS

TECHNICAL FIELD

The present invention relates to a period generator used in a semiconductor device testing apparatus for generating a pulse having a test period which is set, i.e., a pulse having a test pattern generating period, and more particularly, to a period generator for generating such pulses by generating a pulse using a counter with respect to an integer part of the set period and delaying the generated pulse by a decimal fraction part (part lower than decimal point) of the set Period in a delay circuit.

BACKGROUND ART

FIG. 1 shows a conventional period generator of this type. An address from a pattern generator 11 is applied to a period value memory 12 in which various period values are previously set at corresponding addresses and a set period value specified by the address is read out from the period value memory 12 at every enabling period of the pattern generator 11. An integer part I the unit of which is one clock period is set to a coincidence detection counter 13 and a fraction part F of the set period value is applied to one input of an adder 14. The coincidence detection counter 13 counts the number of clocks from a clock generator 15 and supplies an output to a delay circuit 16 when the count of clock coincides with the set integer I. The fraction part F from the period value memory 12 is added to the output of a flip-flop 17 by the adder 14 and the summed result is latched to the flip-flop 17 by the clock from the clock generator 15 and the enabling signal. A carry output of the adder 14 is latched to a flip-flop 18 by the clock and the enabling signal. The fraction part read out from the period value memory 12 is a value less than the clock period T and when the summed result of the adder 14 becomes equal to or greater than the period T, a carry output is generated. When the carry output is generated, an output of the coincidence detection counter 13 is delayed by one clock period T in a delay circuit 16 and is supplied to a variable delay element 19. When the carry output is not generated, the output of the coincidence detection counter 13 passes through the delay circuit 16 without being delayed and is supplied to the variable delay element 19. An output of the delay circuit 16 is supplied to the pattern generator 11 as a next period generation trigger. The output of the flip-flop 17 is set in the delay element 19 as a delay amount.

An output of the delay element 19 is supplied to a delayed waveform generator 22 as an output of the period generator 21. This delayed waveform generator 22 generates a pattern delayed by the delay amount (phase) set by the pattern generator 11 and having a set waveform based on the pulses from the period generator 21 as the reference. This pattern is applied to a pin terminal of an IC under test 24 via a driver 23. Incidentally, the delay circuit 16 is, for example as shown in the figure, arranged such that the output of the coincidence detection counter 13 is supplied to gates 16a and 16b, the output of the flip-flop 18 is supplied to the gate 16b, the inverted output of the flip-flop 18 is supplied to the gate 16a, the output of the gate 16b is supplied to a flip-flop 16c, and the output of the flip-flop 16c and the output of the gate 16a are supplied to an OR gate 16d. The pattern generator 11 is operated by the clock of the clock generator 15. The change of the output data i.e., the address of the period generator changes for every enabling. The delayed waveform generator 22 is also operated by the clock of the clock generator 15. The read timing of the period value memory 12 is determined by the clock of the clock generator 15. Each of the flip-flops 17, 18 and 16c is given at its enabling terminal an output pulse RA of the delay circuit 16 and takes in an input by the clock of the clock generator 15 during the output pulse RA is present.

If a set period $T_S$ is, for example, 2.25T, the integer I=2 from the period value memory 12 is set in the coincidence counter 13 and the fraction F=0.25 is supplied to the adder 14. As shown in FIG. 2, when every two clocks CK (FIG. 2A) are counted, an output is generated from the coincidence detection counter 13. When this output is high level, latches for the flip-flops 17 and 18 are performed by the clock CK. The output value R-D of the flip-flop 17 where the fraction F=0.25 is to be accumulated is initially 0. During the time when a carry is not generated from the adder 14, as shown in FIG. 2B, the output RA is generated from the delay circuit 16. This output RA is delayed in the delay element 19 by the output value RMD of the flip-flop 17. The delay amount in the delay element 19 is, as shown in FIG. 2C, initially 0 and then increases by 0.25T every time an output is generated from the coincidence detection counter 13 to become 0.25T, 0.5T, 0.75T, 0.0T, 0.25T . . . When the delay amount becomes 1.0T and a carry is generated from the adder 14, the delay amount becomes 0.0T. At this timer the output of the coincidence detection counter 13 is delayed by one clock period T in the delay circuit 16. In such a way, as shown in FIGS. 2D, pulses of every 2.25T are outputted from the delay element 19.

In order to generate a high speed test pattern by reducing the test period $T_S$, it is necessary to increase the operation speed of each function block part. However, when a high speed test pattern generation is desired using low cost and low speed function blocks, so called interleave approach is taken. For example, in order to make a high speed operation of the delayed waveform generator 22 by two way interleave method using low speed function blocks, as shown in FIG. 3, the delay part of the delayed waveform generator 22 comprises two series of delay elements 25 and 26. Delay amounts $D_{P1}$ and $D_{P2}$ are set by the pattern generator 11 and the outputs of the delay elements 25 and 26 are assembled by an OR circuit 27 into one series to be supplied to a waveform generation part 28. At this time, each of the delay elements 25 and 26 could operate in ½ speed of the speed of the test period $T_S$.

In this example, the fraction delay by the delay element 19 in the period generator 21 is performed by the delay elements 25 and 26. The output of the delay circuit 16 is supplied to the delay element 25 by a switch 29 at the odd order of the test period $T_S$ and is supplied to the delay element 26 at the even order of the test period $T_S$. The accumulated fraction value RMD of the flip-flop 17 is added to the delay amount $D_{P1}$ for the delay element 25 in the adder 32 via a switch 31 at the odd order of the test period $T_S$ and is added to the delay amount $D_{P2}$ for the delay element 26 in the adder 33 at the even order of the test period $T_S$. In such an arrangement, the delay element 19 requiring a high speed operation in the period generator 21 is not necessary and the delay elements 25 and 26 in the delayed waveform generator 22 may be low speed operation delay elements.

When the example shown in FIG. 2 is operated using the arrangement shown in FIG. 3, as shown in FIG. 4, the output RA (FIG. 4B) of the delay circuit 16 is alternately supplied to the delay elements 25 and 26 as shown in FIGS. 4C and 4D. The output value RMD (FIG. 4E) is also alternately distributed and is added to the respective delay amounts $D_{P1}$ and $D_{P2}$ of the delay elements 25 and 26 as shown in FIGS. 4E and 4G.

In the arrangement shown in FIG. 3, the adder 14 in the period generator 21 needs to complete the arithmetic operation for each test period $T_S$. That is, the adder 14 needs to operate in high speed.

DISCLOSURE OF THE INVENTION

In accordance with a first embodiment of the invention, fractions in the set period values are supplied to first stage flip-flops for first through nth fractions (n is an integer equal to or greater than 2) respectively, the outputs of the first stage flip-flops for the second through nth fractions are supplied to second stage flip-flops for the second through nth fractions respectively, the outputs of the first stage flip-flops for the first through nth fractions are summed and accumulated by a first accumulator, at this time, the output of the first stage flip-flop for nth fraction is summed lastly, a value less than a clock period in the summed and accumulated result is outputted as the summed and accumulated result, a carry of the last summing is outputted, the outputs of the first stage flip-flops for the first through (i−1)th fractions (i=2, 3, . . . , n) and the outputs of the second stage flip-flops for the i-th through nth fractions are summed in an i-th accumulator, at this time, the output of the first stage flip-flop for (i−1)th fraction is summed lastly, a value less than the clock period in the summed and accumulated result is outputted as the summed and accumulated value of the i-th accumulator, and the carry of the last summing is outputted from the i-th accumulator. The summed and accumulated result of the first accumulator is supplied to a third stage flip-flop, the integer parts of the set periods are supplied to first stage flip-flops for first through nth integers, the outputs of the first stage flip-flops for these first through nth integers are supplied to second stage flip-flops for the first through nth integers respectively, the outputs of the second stage flip-flops for the first through nth integers are supplied to first through nth coincidence detection counters respectively, these first through nth coincidence detection counters count the clock starting from the respective initial values by an activation command, outputs are generated when counted values coincide with the corresponding input integer values, the outputs of the first through nth coincidence detection counters are supplied respectively to first through nth delay circuits, the first through nth delay circuits are controlled respectively by carries of the second through (n+1)th (n+1=1) accumulators, each input to the delay circuit is delayed by one clock period and outputted when the corresponding carry exists, each input to the delay circuit is outputted without delay when the corresponding carry does not exist, and the outputs of the first through nth coincidence detection counters are supplied respectively to the activation terminals of the second through (n+1)th coincidence detection counters. The outputs of the first through nth delay circuits are supplied respectively to first through nth delay elements, delay amounts of these first through nth delay elements are set respectively by the outputs of the second through nth accumulators and a third stage flip-flop, the outputs of these first through nth delay elements are assembled by an OR circuit. Loading of each coincidence detection counter and each flip-flop are enabled by an output of p-th delay circuit (p is any one of 1-n), and each q-th delay circuit (q is any one of 1-n other than p) comprises q-th delay adjusting means for delaying the control of carry output from the accumulator by one enabling period when the output of the second stage flip-flop for the q-th integer is other than zero.

In accordance with a second embodiment of the invention, an address series having enabling period from the pattern generator is converted Into first through nth address series having n time enabling periods by address series conversion means. The period value memory is read out by these first through nth address series. The read first through nth fractions are stored respectively in the first stage flip-flops for the first through nth fractions. The read first through nth integers are stored respectively in the first stage flip-flops for the first through nth integers. A delay data series having enabling period from the pattern generator is converted into first through nth delay data series having n time enabling periods by delay data series conversion means. These first through nth delay data series are added respectively to the outputs of the first through nth accumulators by respective first through nth adders and the results are set respectively in the first through nth delay elements as respective delay amounts.

In accordance with a third embodiment of the invention, although the outputs are obtained from the first through nth delay circuits, the summed and accumulated values (fractions) from the first through nth accumulators are not sent out to the delayed waveform generation part. A period value memory similar to the aforementioned period value memory is provided in the delayed waveform generation part. This period value memory is read out by the first through nth address series, and the first through nth fractions are summed and accumulated respectively by the n accumulators as mentioned above. in this case, since the carry output is not necessary, the sequence of the addition need not be defined. These n summed and accumulated results are added to the n delay data series respectively by the first through nth adders and the results of the additions are set respectively in the first through nth delay elements as the respective delay amounts.

In accordance with a fourth embodiment of the invention, the period value memory is read out by the first through nth address series from the pattern generator, and the first through nth delay data series are directly supplied to the respective first through nth adders from the pattern generator.

In accordance with a fifth embodiment of the invention, a first and a second period value memories are read out by the first through nth address series from the pattern generator and the first through nth delay data series are directly supplied to the respective first through nth adders from the pattern generator.

In any one of the second through the fifth embodiments, first through nth waveform generating means are interposed between the output side of respective first through nth delay elements and the OR circuit. The waveform generation is performed in each of the first through nth waveform generating means by the first through nth pattern data series having n time enabling periods into which a pattern data series having enabling period from the pattern generator is converted.

In the accumulator in the invention of any one of the claims, the lower digit portion of the input is summed and accumulated by a lower digit summing part. Each carry from the lower digit summing part and the upper digit portion of the input are summed and accumulated by an upper digit summing part, and the accumulated value is added to the upper side of the accumulated value of the lower digit summing part. That is, the summing and accumulating operation is performed for the lower digit portion and the upper digit portion in pipelined process.

BRIEF DESCRIPTION OF THE DRAWINGS

FIG. 8B is a block diagram of an integer example;

BEST MODE FOR CARRYING OUT THE INVENTION

Figure 1:
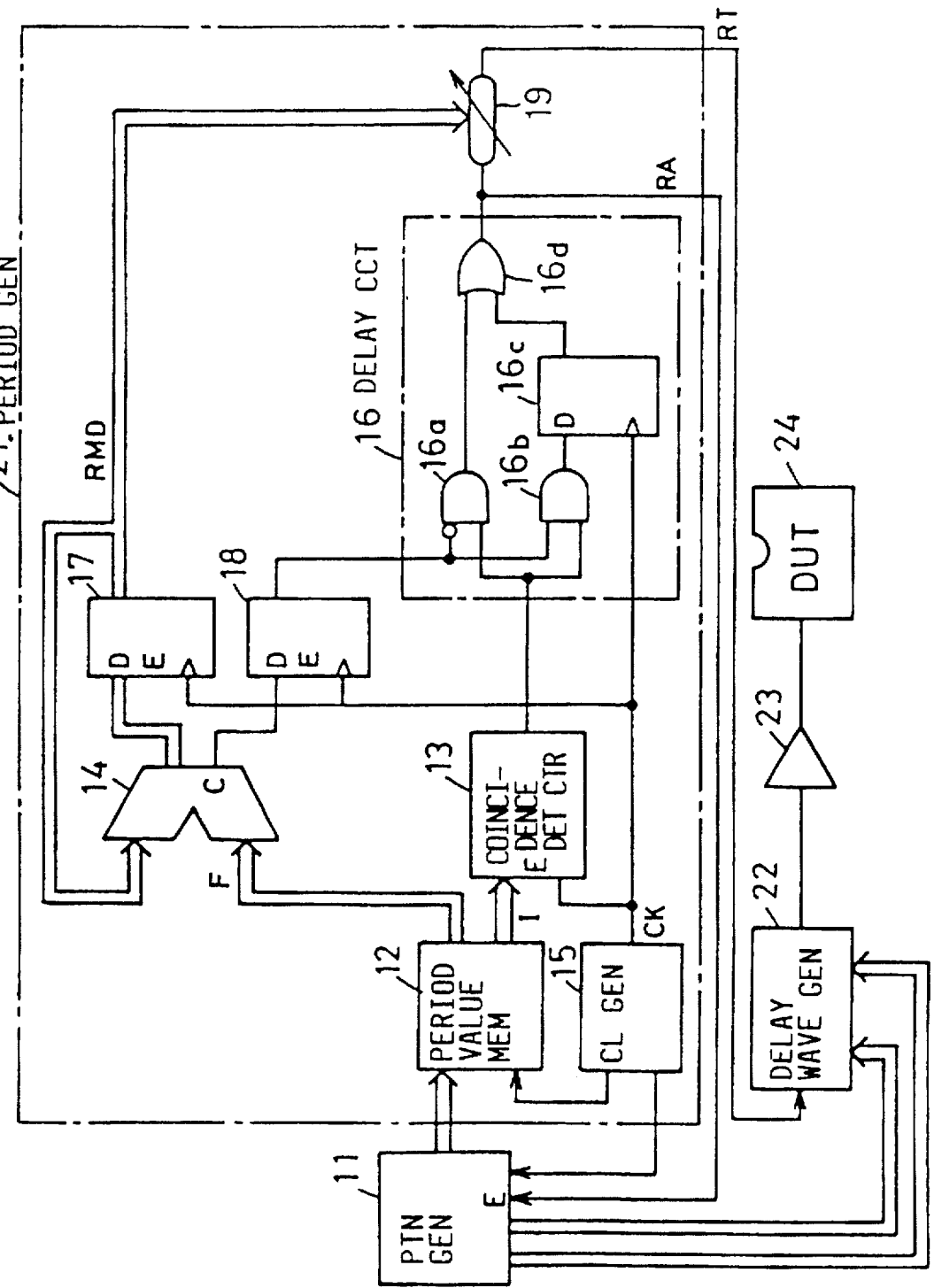
FIG. 1 is a block diagram showing a period generator and its peripheral portion used for a conventional semiconductor test equipment.
Figure 2:
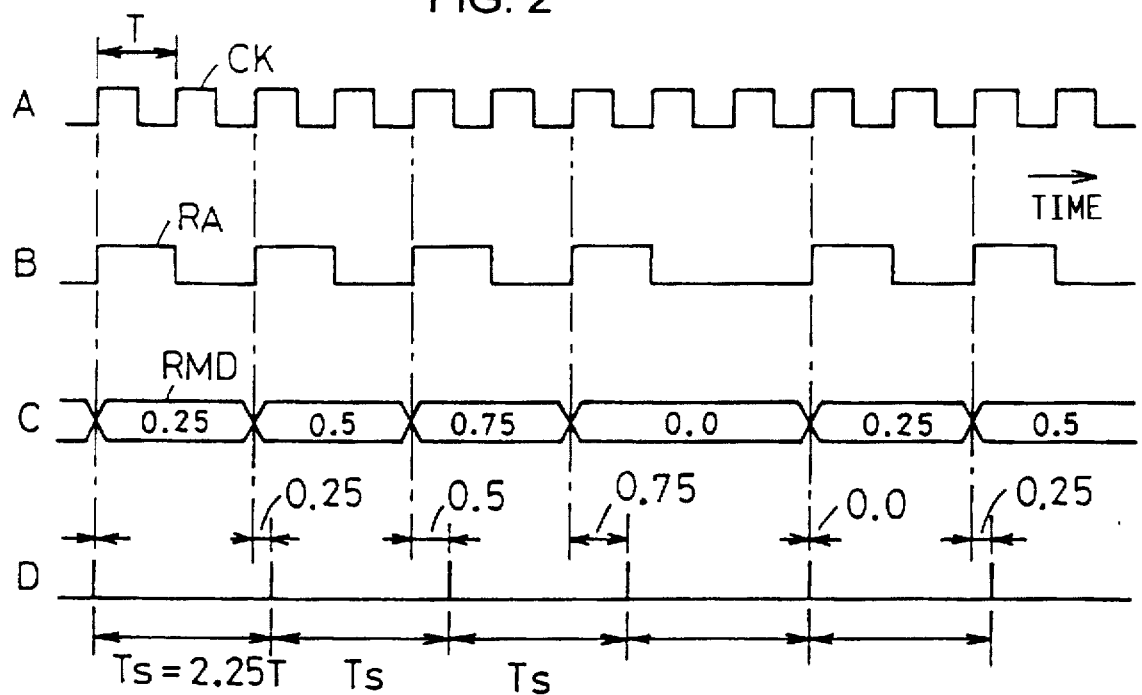
FIG. 2 is a time chart for explaining the operation of the period generator in FIG. 1.
Figure 3:
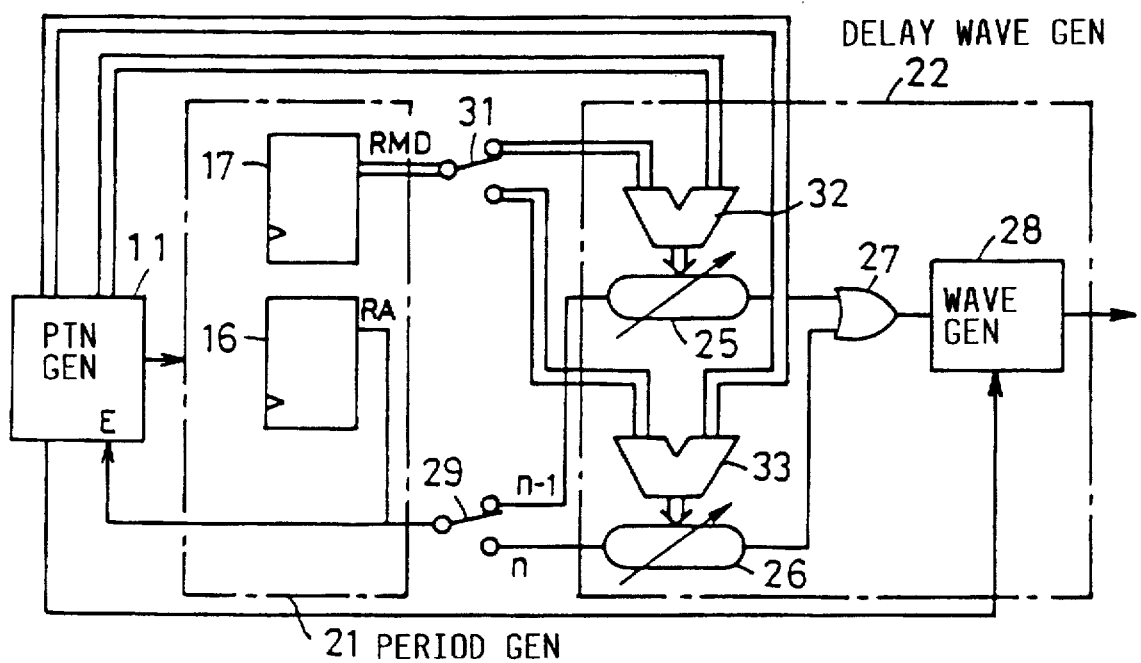
FIG. 3 is a block diagram showing the relationship between the period generator and a delayed waveform generator wherein the delay part of the delayed waveform generator is interleaved into two lines.
Figure 4:
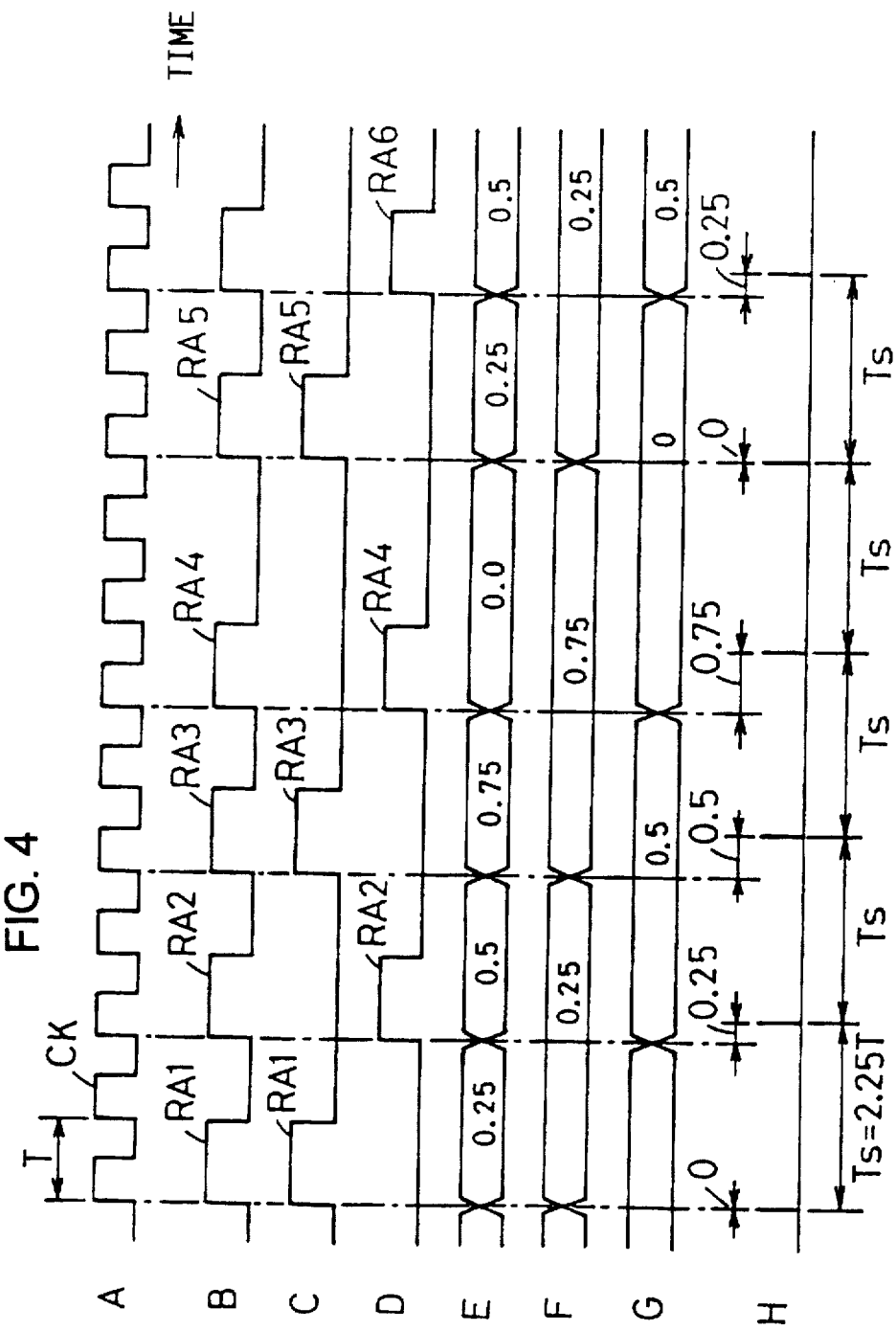
FIG. 4 is a time chart for explaining the operation of FIG. 3.
Figure 5:
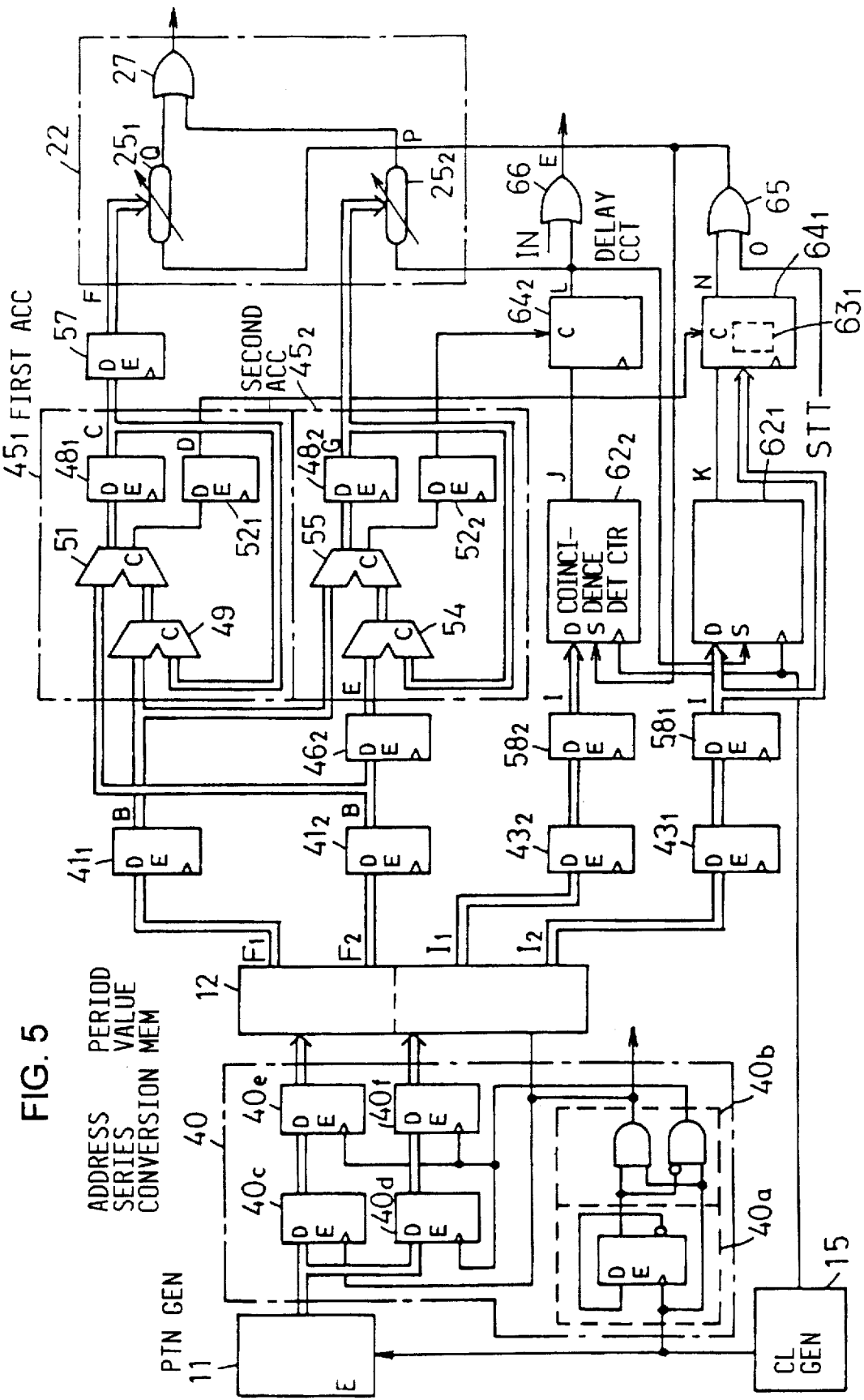
FIG. 5 is a block diagram showing an embodiment of the present invention.

FIG. 5 shows an embodiment of the present invention. In FIG. 5 the same reference characters are assigned to the portions or components corresponding to those in FIGS. 1 and 3. In this embodiment, period signals are generated in two systems (n=2) and an address series from the pattern generator 11 is converted and distributed by the address series conversion means 40 into two systems of address series each address series having twice the clock period T. For example, the clock CK is frequency divided into ½ frequency by a frequency dividing circuit 40a. Two gates of a distribution circuit 40b are controlled by the output of the frequency dividing circuit such that the clock CK is distributed into two systems of clock series in which one clock series has its period shifted by 2T and its phase shifted by T from the other. The address series having enabling period from the pattern generator 11 is taken in the flip-flops 40c and 40d by these two series of clocks, and is distributed into odd numbers and even numbers of the address series. The outputs of the flip-flops 40c and 40d are taken in the flip-flops 40e and 40f, respectively, by one output clocks of the distribution circuit 40b and hence, two systems of address series having the same phase with each other. The period value memory 12 is read out by these two address series at the take-in timing of the flip-flops 40e and 40f. The data are stored in the period memory 12 such that a data to be read in odd number and a data to be read in even number each having the same contents as in the period memory 12 of FIG. 1 are read out at the same time by the two systems of address series, respectively.

The fractions (values less than period T) $F_1$ and $F_2$ in the period values read out from the period memory 12 are inputted respectively to flip-flops (first stage flip-flops for the first and the second fractions) $41_1$ and $41_2$. The read integers $I_1$ and $I_2$ are supplied respectively to flip-flops (first stage flip-flops for the first and the second integers) $43_1$ and $43_2$. Each output of the flip-flops $41_1$ and $41_2$ is supplied to a first accumulator $45_1$. The output of the flip-flop $41_2$ is supplied to a flip-flop (second stage flip-flop for the fraction) $46_2$. Each output of the flip-flops $41_1$ and $46_2$ is supplied to a second accumulator $45_2$. The first accumulator $45_1$ adds the output of the flip-flop $41_1$ to the output of a flip-flop $48_1$ in an adder 49, then adds this summed value to the output of the flip-flop $41_2$ in an adder 51. This summed result is then stored in the flip-flop $48_1$ and the carry output of the adder 51 is stored in a flip-flop $52_1$. The second accumulator $45_2$ adds the output of a flip-flop $46_2$ to the output of a flip-flop $48_2$ in an adder $54_1$, then adds this summed result to the output of the flip-flop $41_1$ in an adder 55. This summed result is then stored in the flip-flop $48_2$ and the carry output of the adder 55 is stored in a flip-flop $52_2$. The output of the accumulator $45_1$ is supplied to a flip-flop 57. Either of the accumulators $45_1$ and $45_2$ operates on the clock period T as the unit. That is, in the summed and accumulated result, the value less than T is the fraction and the value equal to or greater than T is the integer.

On the other hand, the outputs of the flip-flops $43_1$ and $43_2$ are supplied to coincidence detection counters $62_1$ and $62_2$ via flip-flops (second stage flip-flops for first and second integers) $58_1$ and $58_2$ respectively. The outputs of the coincidence detection counters $62_1$ and $62_2$ are supplied to delay circuits $64_1$ and $64_2$ respectively. The delay circuit $64_2$ has the same structure as the delay circuit 16 in FIG. 1. The delay circuit $64_2$ is controlled by the output of the flip-flop $52_2$ such that an input is delayed by one clock period T in the delay circuit $64_2$ when a carry is generated and an input passes through the delay circuit $64_2$ without delay when a carry is not generated. However, delay adjusting means $63_1$ is provided in the delay circuit $64_1$ other than the delay circuit $64_2$ which sends an enabling output E from an OR circuit 66. That is, since each Dart is enabled by the output pulse of the delay circuit $64_2$ and the period of the output pulse is used as the enabling period, when a set period to be generated is longer than the period of the reference clock CK, the delay circuit $64_2$ can be controlled by the output state of the flip-flop $52_2$ which is just before the delay circuit $64_2$ but the other delay circuit $64_1$ cannot properly be controlled because the output state of the flip-flop $52_1$ has been changed by the generation of the enabling output. In order to solve this problem, the aforementioned delay adjustment means is provided.

Figure 13A:
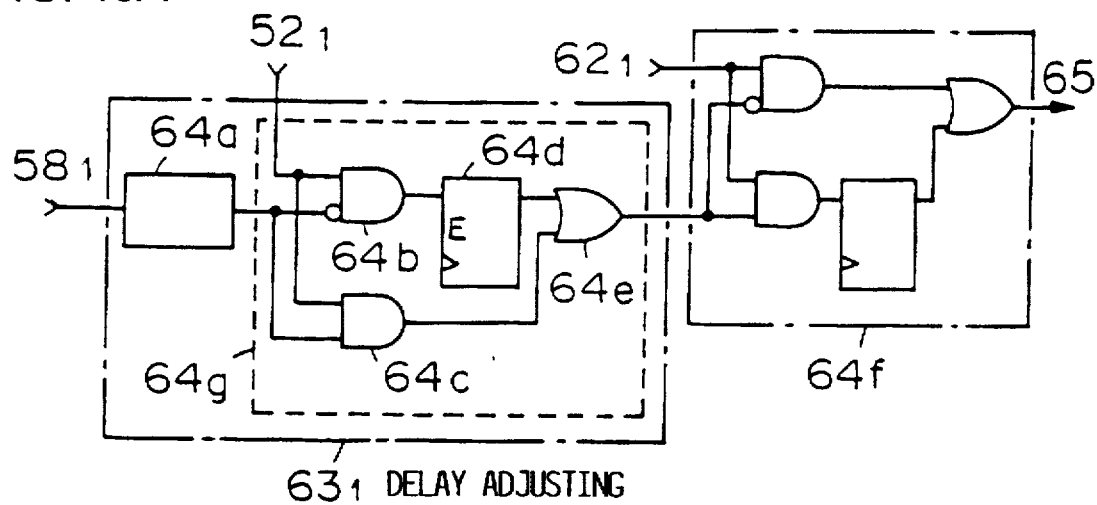
FIG. 13A is a logic circuit diagram showing a specific example of the delay circuit $64_1$ in FIG. 5.

That is, as shown in FIG. 13A, the output of the flip-flop $58_1$ is also supplied to a zero detection circuit 64a in the delay adjusting means $63_1$. When the output value of the flip-flop $58_1$ is zero, the output of the zero detection circuit 64a becomes high level. The output of the flip-flop $52_1$ is supplied to an inhibit gate 64b and a gate 64c. These gates 64b and 64c are controlled by the output of the zero detection circuit 64a. The output of the inhibit gate 64b is supplied to a data terminal of a flip-flop 64d. The output of the flip-flop 64d and the output of the gate 64c are supplied to an OR gate 64e. The output of the OR gate 64e is supplied as a control signal to a circuit 64f having the same arrangement as the delay circuit 16 in FIG. 1. The output of the coincidence detection counter $62_1$ is supplied to this circuit 64f. The gates 64b and 64c, the flip-flop 64d and the OR gate 64e comprise a carry holding circuit 64g. When the output of the zero detection circuit 64a is high level, the control signal from the flip-flop $52_1$ is immediately supplied to the circuit 64f. That is, the delay circuit $64_1$ performs similar operation to that of the delay circuit $64_2$. However, when the output of the zero detection circuit 64a is low level, the control signal from the flip-flop $52_1$ is supplied to the circuit 64f after one enabling period delay (will be described later). The output of the delay circuit $64_2$ is supplied to a delay element $25_2$ and to an activation terminal S of the coincidence detection counter $62_1$. The output of the delay circuit $64_1$ is supplied to a delay element $25_1$ and to an activation terminal S of the coincidence detection counter $62_2$ via an OR circuit 65. The output of the delay circuit $64_2$ is also supplied to an OR circuit 66 to which an initialization signal IN is inputted. The output of the OR circuit 66 is supplied, although not shown in the figure, to the enabling terminals E of all the flip-flops in FIG. 5 and also enables the loading of the coincidence detection counters. The clock CR from the clock generator 15 is supplied to the trigger terminal of each flip-flop. Each of the coincidence detection counters $62_1$ and $62_2$ is reset when an activation signal is supplied to its activation terminal S and then starts counting of the clock from the initial value. When the count value coincides with the input value, the coincidence detection counter generates an output. In each of the adders 49, 51, 54 and 55, when the summed value exceeds the period T of the clock CK, the excess portion is outputted as the summed result and a carry is also outputted.

The operation of the embodiment shown in FIG. 5 wherein the period T of the clock CK is 8 ns (125 MHz) and the generating period is 7 ns will be explained referring to FIG. 6. In this case, 7s are read out from the period value memory 12 as fractions $F_1$ and $F_2$ respectively. Also, 0s are read out from the period value memory 12 as integers $I_1$ and $I_2$ respectively. As shown in FIG. 6M, when an initialization signal IN of two clock period length is inputted under the state where an address is given to the input of the period value memory 12 from the pattern generator 11, 7s are taken in the flip-flops $41_1$ and $41_2$ respectively as shown in FIG. 6B by the rising edge of the clock $CK_1$ (FIG. 6A) just after the initialization signal input. Also, 0s are taken in the flip-flops $43_1$ and $43_2$ respectively as shown in FIG. 6I. In this state, the adder 49 adds the output 7 of the flip-flop $41_1$ to the output 0 of the flip-flop $48_1$ and outputs the summed result 7. Then the adder 51 adds this summed result 7 to the output 7 of the flip-flop 412 and outputs (7+7)−8=6 as the summed result. The adder 51 also outputs a carry. The adder 54 adds 0 to 0. The adder 55 adds this summed result 0 to the output 7 of the flip-flop $41_1$ and outputs the summed result 7.

Figure 6:
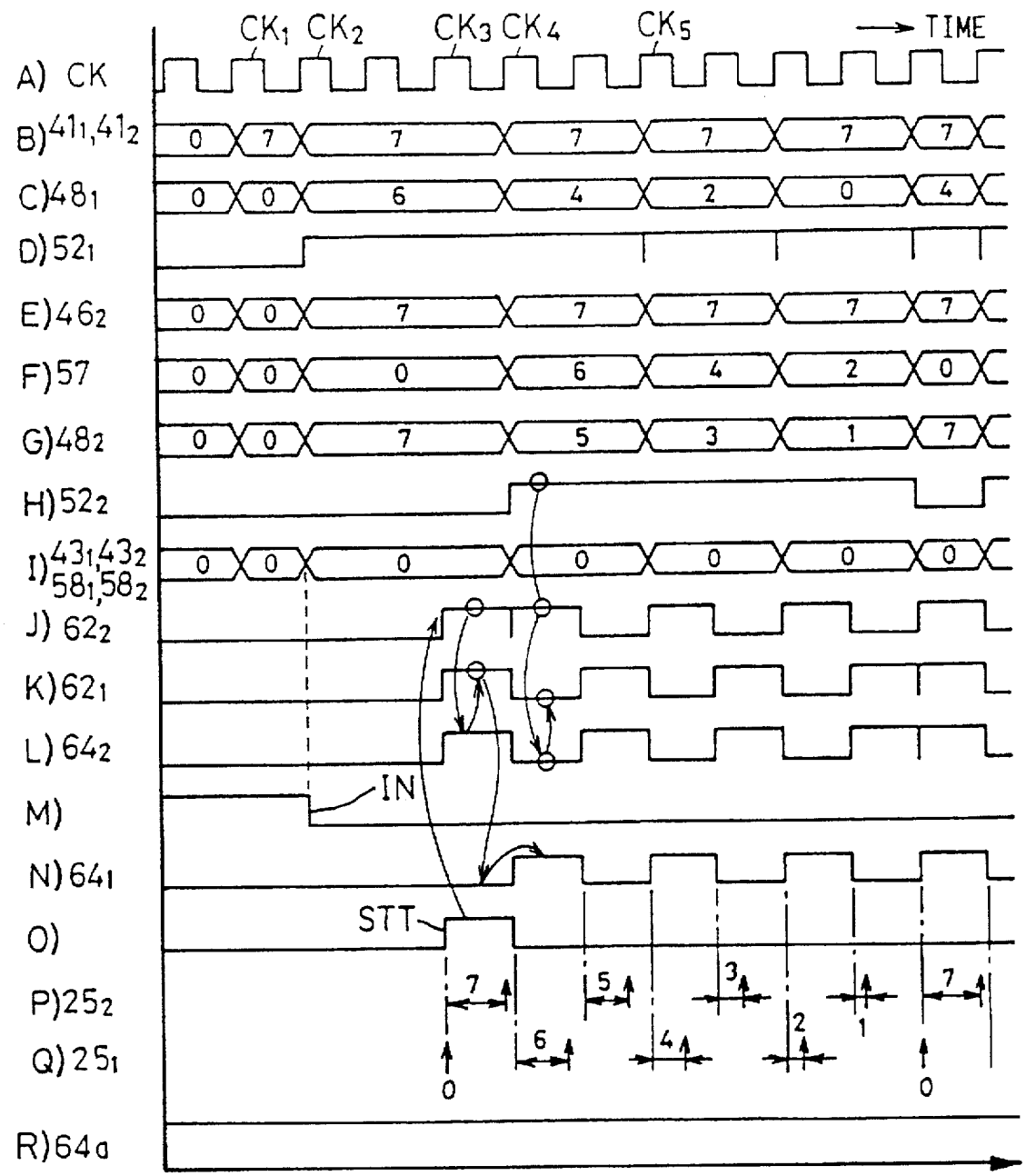
FIG. 6 and FIG. 7 are time charts respectively showing the state of each part in the operation example of the embodiment shown in FIG. 5.
Figure 7:
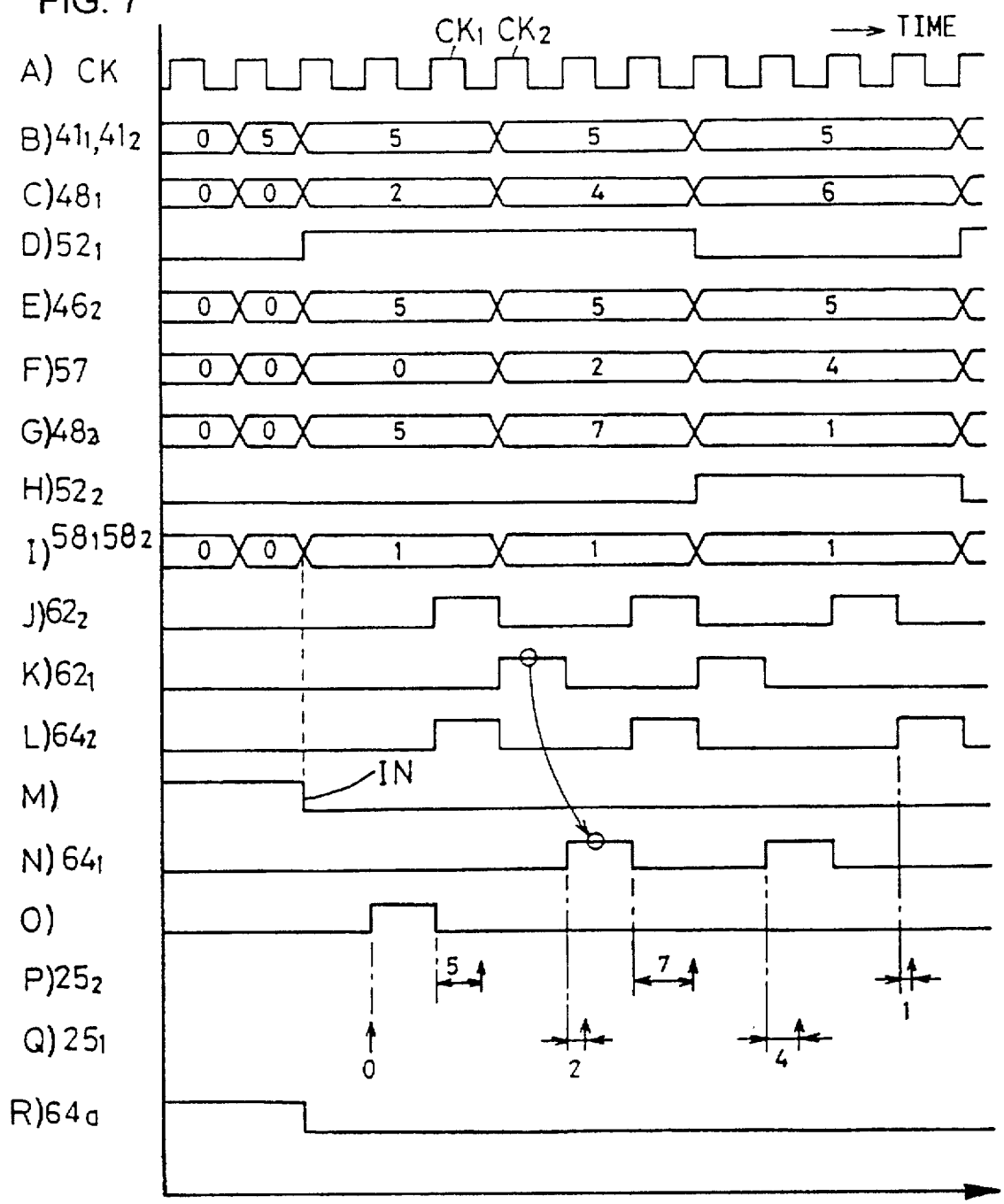

Therefore, as shown in FIG. 6C, 6 is outputted from the flip-flop $48_1$ by the rising edge of the next clock $CK_2$. As shown in FIG. 6D, a carry output is generated from the flip-flop $52_1$. The output of the flip-flop $46_2$ becomes 7 as shown in FIG. 6E. As shown in FIG. 6G, 7 is outputted from the flip-flop $48_2$. As shown in FIG. 6H, the output of the flip-flop $52_2$ remains at low level. Further, 0 is outputted from each of the flip-flops $58_1$ and $58_2$ and is inputted to the respective counters $62_1$ and $62_2$. In this state, 7 and 6 are inputted to the adder 49 and 5 is outputted therefrom. This 5 and 7 are inputted to the adder 51 and 4 is outputted therefrom. At this time, a carry is also outputted from the adder 51. 7 and 7 are inputted to the adder 54 and 6 is outputted therefrom. This 6 and 7 are summed by the adder 55 and 5 is outputted therefrom. At this time, a carry is also outputted from the adder 55.

It is understood that in each of the accumulators $45_1$ and $45_2$, a fraction 7 is summed and accumulated at each clock CK and the accumulator $45_1$ advances ahead of the accumulator $45_2$ by one enabling period in the operation. in this case, one enabling period is defined as a period for enabling each flip-flop i.e., a period of the output E of the OR circuit 66. In this state, after the initialization signal IN is removed, when a start signal STT is inputted in synchronization with, for example, clock $CK_3$ as shown in FIG. 6O, the rising edge of the start signal STT is outputted first from the delay element $25_1$ without delay (0 ns delay) as shown in FIG. 6Q. At the same time, the coincidence detection counter $62_2$ is activated. Since the input of the coincidence detection counter $62_2$ is 0, the output of the coincidence detection counter $62_2$ becomes high level as shown in FIG. 6J. At this time, since a carry is not outputted from the flip-flop $52_2$ as shown in FIG. 6H, the output of the counter $62_2$ immediately passes through the delay circuit $64_2$ and the output of the delay circuit $64_2$ becomes high level as shown in FIG. 6L. Therefore, the coincidence detection counter $62_1$ is also activated. Since the input of the coincidence detection counter $62_1$ is also 0, the output of the coincidence detection counter $62_1$ also becomes high level as shown in FIG. 6K. However, since the output of the flip-flop $52_1$ is high level and the output R of zero detection circuit 64a is high level, the output of next delay circuit $64_1$ becomes high level after delay of one clock period T. Therefore, FIG. 6N remains at low level. Regarding the output of the delay circuit $64_2$ which has been made high level by STT, since the output of the flip-flop $48_2$ is 7, the rising edge of the output of the delay circuit $64_2$ is delayed by 7 ns in the delay element $25_2$ as shown in FIG. 6P. Since the output of the delay circuit $64_2$ becomes high level, each flip-flop is enabled. Thus, the output of the flip-flop $48_1$ becomes 4 at the rising edge of the next clock $CK_4$ as shown in FIG. 6C, a carry is outputted from the flip-flop $5_{21}$, the output of the flip-flop 57 becomes 6 as shown in FIG. 6F, the output of the flip-flop $48_2$ becomes 5 as shown in FIG. 6G and the output of the flip-flop $52_2$ becomes carry state as shown in FIG. 6H. Based on the above operations, as mentioned above, the high level output of the coincidence detection counter $62_1$ is delayed by one clock period T in the delay circuit $64_1$ and the output of the delay circuit $64_1$ becomes high level after delay of one clock period T as shown in FIG. 6N. The coincidence detection counter $62_2$ is activated by the output of the delay circuit $64_1$. Since the output of the flip-flop $58_2$ is 0, the output of the coincidence detection counter $62_2$ immediately becomes high level as shown in FIG. 6J. Since the delay circuit $64_2$ is in delay state of one clock period T due to the output of the flip-flop $52_2$, the output of the delay circuit $64_2$ becomes low level as shown in FIG. 6L. Therefore, the coincidence detection counter $62_1$ is in operation stop state and its output is low level as shown in FIG. 6K. The output of the delay circuit $64_1$ which is high level output delayed by one clock period T is delayed by 6 ns as shown in FIG. 6Q in the delay element $25_1$ since the output of the flip-flop 57 is 6. When time elapses by one clock period T from the rising edge of the clock $CK_4$, the high level output of the coincidence detection counter $62_2$ is outputted from delay circuit $64_2$ and the output of the delay circuit $64_2$ becomes high level as shown in FIG. 6L. This output is delayed by 5 ns in the delay element $25_2$ as shown in FIG. 6P due to the output value 5 of the flip-flop $48_2$. In this state, the summed result of the adder 51 is 2 and the summed result of the adder 55 is 3. When the output of the delay circuit $64_2$ becomes high level, loading of each coincidence detection counter and each flip-flop are enabled as in the previous operations.

Therefore, at the rising edge of the next clock $CK_5$, the output of the flip-flop $48_1$ becomes 2, the output of the flip-flop 57 becomes 4, the output of the flip-flop $48_2$ becomes 3, and thus pulses of 7 ns period are obtained from the OR circuit 27 in the similar operations hereinafter. As apparent from the time chart of FIG. 6, the accumulators $45_1$ and $45_2$ can operate the arithmetic operations within two clock periods, and thus the operation speed may be a half of the conventional system. In this embodiment, an example of constant period was explained for the simple explanation purpose. However, it is a matter of course that the period can be changed in real time in accordance with the addresses from the pattern generator by storing various period values in the period value memory.

FIG. 7 shows a time chart showing the operation of each part of FIG. 5 when the generating period is 13 ns. in this case, 5 s are read out as the fractions $F_1$ and $F_2$, and 1s are read out as the integers $I_1$ and $I_2$ from the period value memory 12. By the initialization signal IN, the output of the flip-flop $48_1$ becomes 2 (FIG. 7C), the output of the flip-flop 52, becomes high level (FIG. 7D), the output of the flip-flop $52_2$ becomes low level (FIG. 7H), and each output of the flip-flops $58_2$ and $58_1$ becomes 1 (FIG. 7I). When the activation signal STT (FIG. 7O) is given, similarly to the 7 ns case, the rising edge of this STT is outputted as it is as shown in FIG. 7Q since the output of the flip-flop 57 for the delay element $25_1$ is 0. Then the coincidence detection counter $62_2$ starts the operation and counts 1 at the rising edge of next clock $CK_1$, and the output of the coincidence detection counter $62_2$ becomes high level (FIG. 7J). This output of the coincidence detection counter $62_2$ passes through the delay circuit $64_2$ without delay and is supplied to the delay element $25_2$. Since the output 5 of the flip-flop $48_2$ is set in the delay element $25_2$, an output is sent out from the delay element $25_2$ as shown in FIG. 7P after 5 ns delay from the rising edge of the high level output of the delay circuit $64_2$. That is, this output is sent out from the delay element $25_2$ after 13 ns delay from the rising edge of the activation signal STT.

In addition, the coincidence detection counter $62_1$ is activated, each flip-flop is enabled, and loading of the coincidence detection counter is enabled by the output of this delay circuit $64_2$. Thus, at the rising edge of the next clock $CK_2$, the output of the flip-flop $48_1$ becomes 4 (FIG. 7C), the output of the flip-flop $52_1$ becomes high level (FIG. 7D), the output of the flip-flop $48_2$ becomes 7 (FIG. 7G), and the output of the flip-flop $52_2$ becomes low level (FIG. 7H). Further, the coincidence detection counter $62_1$ counts 1 and its output becomes high level (FIG. 7K). Since the output of the zero detection circuit 64a is low level in the delay circuit $64_1$, the output of the flip-flop $52_1$ of last enabling period is selected in the carry holding circuit 64f. Since the output of the flip-flop $52_1$ was high level at that time, the output of the coincidence detection counter $62_1$ is delayed by one clock period (FIG. 7N) and is supplied to the delay element $25_1$. This is further delayed by 2 ns (FIG. 7F) in the delay element $25_1$ based on the output of the flip-flop 57. Thus, a pulse rising up after 13 ns delay from the rising edge (FIG. 7P) of the previous output of the delay element $25_2$ is outputted as shown in FIG. 7Q. The coincidence detection counter $62_2$ is activated by the output of the delay circuit $64_1$. When the coincidence detection counter $62_2$ counts next clocks the output becomes high level (FIG. 7J) and this rising edge is delayed by 7 ns in the delay element $25_2$ based on the output of the flip-flop $48_2$ as shown in FIG. 7P. Similarly, operations are carried on.

Figure 8A:
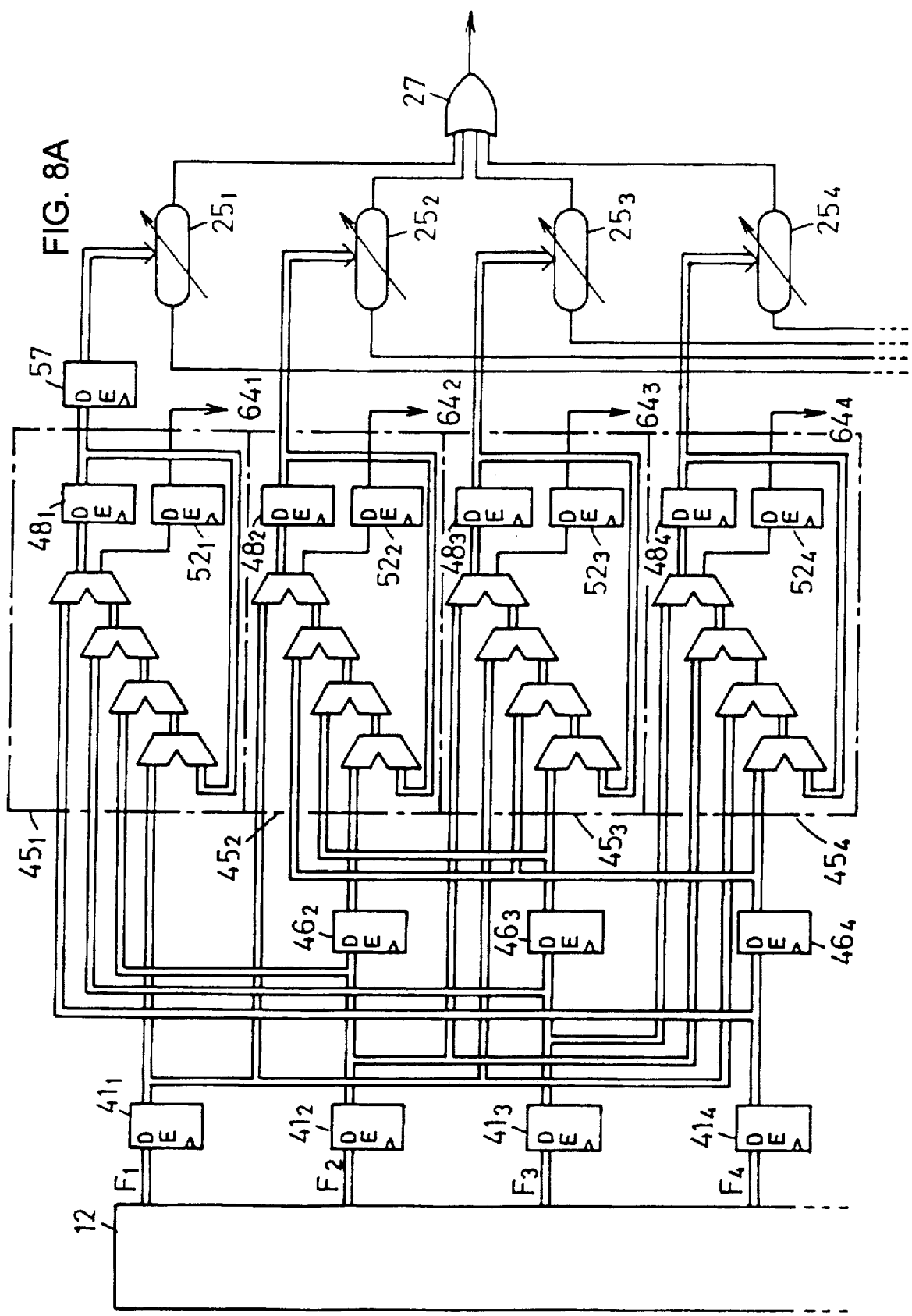
FIGS. 8A and 8B shows an example in which the present invention is applied to four line interleave system, wherein 8A is a block diagram of a fraction example
Figure 8B:
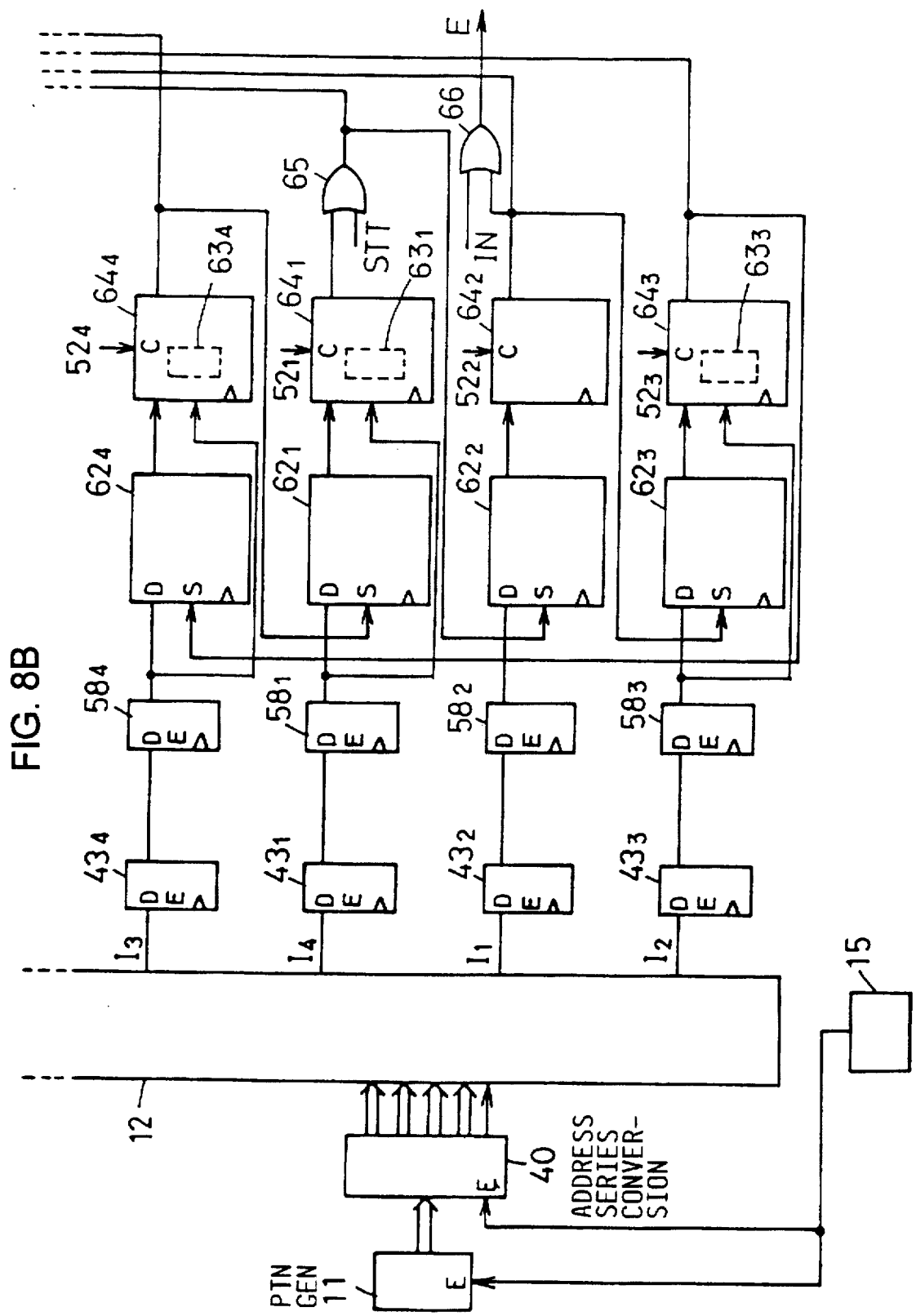

In the above embodiment, a two series interleave system is explained. A more series interleave system is also possible. For examples, FIG. 8 shows an example of a four series interleave system. FIG. 8A shows an arrangement example of the fraction part and FIG. 8B shows an arrangement example of the integer part. These are interconnected each other. An n series (n is equal to or greater than 2) case will be explained below based on this example. An address series having enabling period from the pattern generator is sequentially distributed into four (n) series by address series conversion means 40 in one enabling period basis such that each of the four (n) series has four (n) enabling periods. The period value memory 12 is read out at every 4 (n) enabling periods by these first through fourth (nth) address series. Since the minimum length of one enabling period is one clock period, the minimum length of four (n) enabling periods is four (n) clock periods. Fractions $F_1$–$F_4$ ($F_n$) are taken in the first stage flip-flops $41_1$–$41_4$ ($41_n$) for first through fourth (nth) fractions respectively. The outputs of the first stage flip-flops $41_2$–$41_4$ ($41_n$) for the second through fourth (nth) fraction are supplied respectively to the respectively to the second stage flip-flops $46_2$–$46_4$ for the second through fourth (nth) fractions. Each output of the first stage flip-flops $41_1$–$41_4$ ($41_n$) for first through fourth (nth) fractions is supplied to the first accumulator $45_1$ and summed and accumulated therein. At this time, the output of the first stage flip-flop $41_4$ ($41_n$) for the fourth (nth) fraction is summed lastly. The accumulated result is stored in the flip-flop $48_1$ and the carry output is stored in the carry flip-flop $52_1$. Each output of the second stage flip-flops $46_i$–$46_4$ ($46_n$) for the i-th (i=2,3,4(n)) trough fourth (nth) fractions and each output of the first stage flip-flops $41_1$–$41_{i-1}$ for the first through (i-1)th fractions are inputted to the i-th accumulator $45_i$ and are summed and accumulated therein. At this time, the output of the first stage flip-flop $41_{i-1}$ for (i-1)th fraction is summed lastly. The summed result is stored in the flip-flop $48_i$ and the carry is stored in the carry flip-flop $52_i$.

On the other hand, in FIG. 8B, the first through fourth (nth) integers $I_1$–$I_4$ ($I_n$) read out from the period value memory 12 are stored respectively in the first stage flip-flops $43_2$–$43_1$ ($43_{n+1}$) for the second through the first (nth+1=1) integers. The outputs of these flip-flops $43_1$–$43_4$ ($43_n$) are stored respectively in the second stage flip-flops $58_1$–$58_4$ ($58_n$) for first through fourth (nth) integers. The outputs of these flip-flops $58_1$–$58_4$ ($58_n$) are inputted to and set in the first through fourth (nth) coincidence detection counters $62_1$–$62_4$ ($62_n$). The outputs of the first through fourth (nth) coincidence detection counters $62_1$–$62_4$ ($62_n$) are supplied respectively to the first through fourth (nth) delay circuits $64_1$–$64_4$ ($64_n$). These first through fourth (nth) delay circuits $64_1$–$64_4$ ($64_n$) are controlled respectively by the outputs of the carry flip-flops $52_1$–$52_4$ ($52_n$) of the first through fourth (nth) accumulators $45_1$–$45_4$ ($45_n$). Each of the first delay circuit and the third through the fourth (nth) delay circuits $64_1$, $64_3$–$64_4$ ($64_n$) other than the second delay circuit $64_2$ is constructed in the same arrangement as the delay circuit $64_1$ shown in FIG. 13A. Delay adjusting means $63_1$, $63_3$–$63_4$ ($63_n$) are provided respectively in these delay circuits $64_1$, $64_3$–$64_4$ ($64_n$). The outputs of the second stage flip-flops $58_1$, $58_3$–$58_4$ ($58_n$) are also inputted respectively to these delay circuits $64_1$, $64_3$–$64_4$ ($65_n$) and are utilized respectively to control the respective outputs of the carry flip-flops $52_1$, $52_3$–$52_4$ ($52_n$) to delay or not to delay by one enabling period dependent on whether or not the output of the zero detection circuit 64a is high level and thus to control the respective outputs of the coincidence detection counter $62_1$, $62_3$–$62_4$ ($62_n$) to delay or not to delay. The output of the first delay circuit $64_1$ and the activation signal STT are supplied to the OR circuit 65, and the logical OR output is supplied to the activation terminal of the second coincidence detection counter $62_2$. The outputs of the second through fourth (nth) delay circuit $64_2$–$64_4$ ($64_n$) are supplied respectively to the activation terminals of the third through first ((n+1)th) coincidence detection counters $62_3$–$62_1$ ($62_{n+1}$). The outputs of the first through fourth (nth) delay circuit $64_1$–$64_4$ ($64_n$) are supplied respectively to the first through fourth (nth) delay elements $25_1$–$25_4$ ($25_n$). The outputs of the flip-flops $48_1$–$48_4$ ($48_n$) of the first through fourth (nth) accumulators $45_1$–$45_4$ ($45_n$) are supplied respectively to the first through fourth (nth) delay elements $25_1$–$25_4$ ($25_n$) as the respective set delay amounts. The output of the first accumulator $45_1$ is supplied to the delay element $25_1$ via the flip-flop 57 for timing adjustment. The output of the second delay circuit $64_2$ and the initialization signal IN are inputted to the OR circuit 66 and the logical OR output is supplied to the enabling terminal E of each flip-flop and to the loading/enabling terminal of each coincidence detection counter in FIG. 8. Each flip-flop is triggered by the clock of the clock generator 15 and each of the first through fourth (nth) coincidence detection counters $62_1$–$62_4$ ($62_n$) counts the clock of the clock generator 15.

Figure 9:
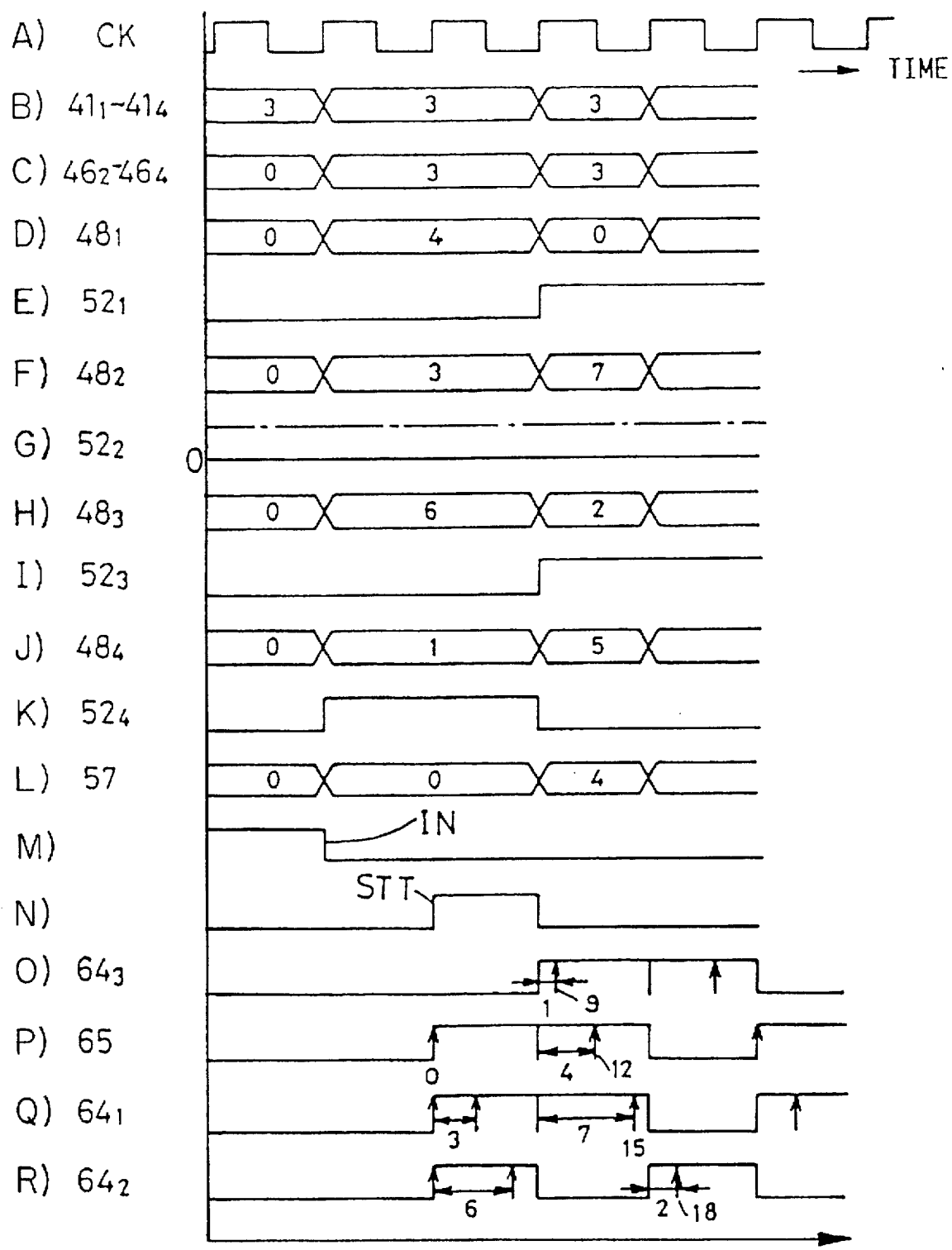
FIG. 9 is a time chart showing the state of each part in the operation example of the embodiment shown in FIG. 8.

FIG. 9 shows a time chart for generating period in the four series interleave system shown in FIG. 8 when the clock period is 8 ns and set period $T_S$ is 3 ns. In this case, each of the fractions $F_1$–$F_4$ read out from the period memory 12 is 3 and each of the integers is 0. By the initialization signal IN, the fraction processing side (FIG. 8A) is operated during two periods of the clock CK. By the first clock, each output of the flip-flops $41_1$–$41_4$ becomes 3 and each output of the flip-flops $46_2$–$46_4$ becomes 0. By the next clock, the output of the flip-flop $48_1$ of the first accumulator $45_1$ becomes 4 (=3+3+3+3=(8+1)+3), the output of the flip-flop $52_1$ becomes high level, the output of the flip-flop $48_2$ of the second accumulator $45_2$ becomes 3 (0+0+0+3), the output of the flip-flop $52_2$ becomes low level, the output of the flip-flop $48_3$ of the third accumulator $45_3$ becomes 6 (=0+0+3+3), the output of the flip-flop $48_4$ of the fourth accumulator $45_4$ becomes 1 (=0+3+3+3=8+1), the output of the flip-flop $52_4$ becomes high level, and the output of the flip-flop 57 becomes 0.

When the activation signal STT is inputted in this state, an output is generated from the OR circuit 65 and is supplied to the delay element $25_1$ Since the delay amount (output of the flip-flop 57) is 0, the signal supplied to the delay element $25_1$ is immediately outputted from the OR circuit 27. The outputs of the OR circuit 27 are indicated by arrows in FIG. 9. The output of the activation signal STT from the OR circuit 65 is supplied to the coincidence detection counter $62_2$. Since the input of the coincidence detection counter $62_2$ is 0, the output is immediately generated from the coincidence detection counter $62_2$. Similarly, the coincidence detection counters $62_3$ and $62_4$ are also sequentially and immediately activated. Each input to these coincidence detection counters is 0, an output is immediately generated from each of the coincidence detection counters $62_3$ and $62_4$. Since the control inputs for the delay circuits $64_2$ and $64_3$ are low level, the outputs are generated therefrom simultaneously with the activation signal STT. However, since the control input for the delay circuit $64_4$ is high level, the output is delayed by one clock period T. Since the set delay amounts for the delay elements $25_2$ and $25_3$ are 3 and 6 respectively, their outputs are delayed therein by 3 ns and 6 ns respectively and outputted from the OR circuit 27. The output from the delay circuit $64_4$ is delayed by 1 ns in the delay element $25_4$ and outputted from the OR circuit 27. The coincidence detection counter $62_1$ is activated by the output of the delay circuit $64_4$. Since the input is 0, similarly to the above, the outputs are sequentially and immediately generated from the coincidence detection counters $62_1$, $62_2$ and $62_3$. Each of the accumulators $45_1$–$45_4$ performs summing and accumulation once and then the outputs of the flip-flops $48_1$–$48_4$ become 0, 7, 2 and 5 respectively. Also, the outputs of the flip-flops $52_1$–$52_4$ become high level, low level, high level and low level respectively. Further, the output of the flip-flop 57 becomes 4, and the outputs of the OR circuits 65 and the delay circuit $64_2$ are delayed by 4 ns and 7 ns respectively. The output of the delay circuit $64_3$ is delayed by one clock period T as the output of the flip-flop $52_3$ is high level and then further delayed by 2 ns and outputted from the OR circuit 27. Similarly the operations are carried on.

Figure 10:
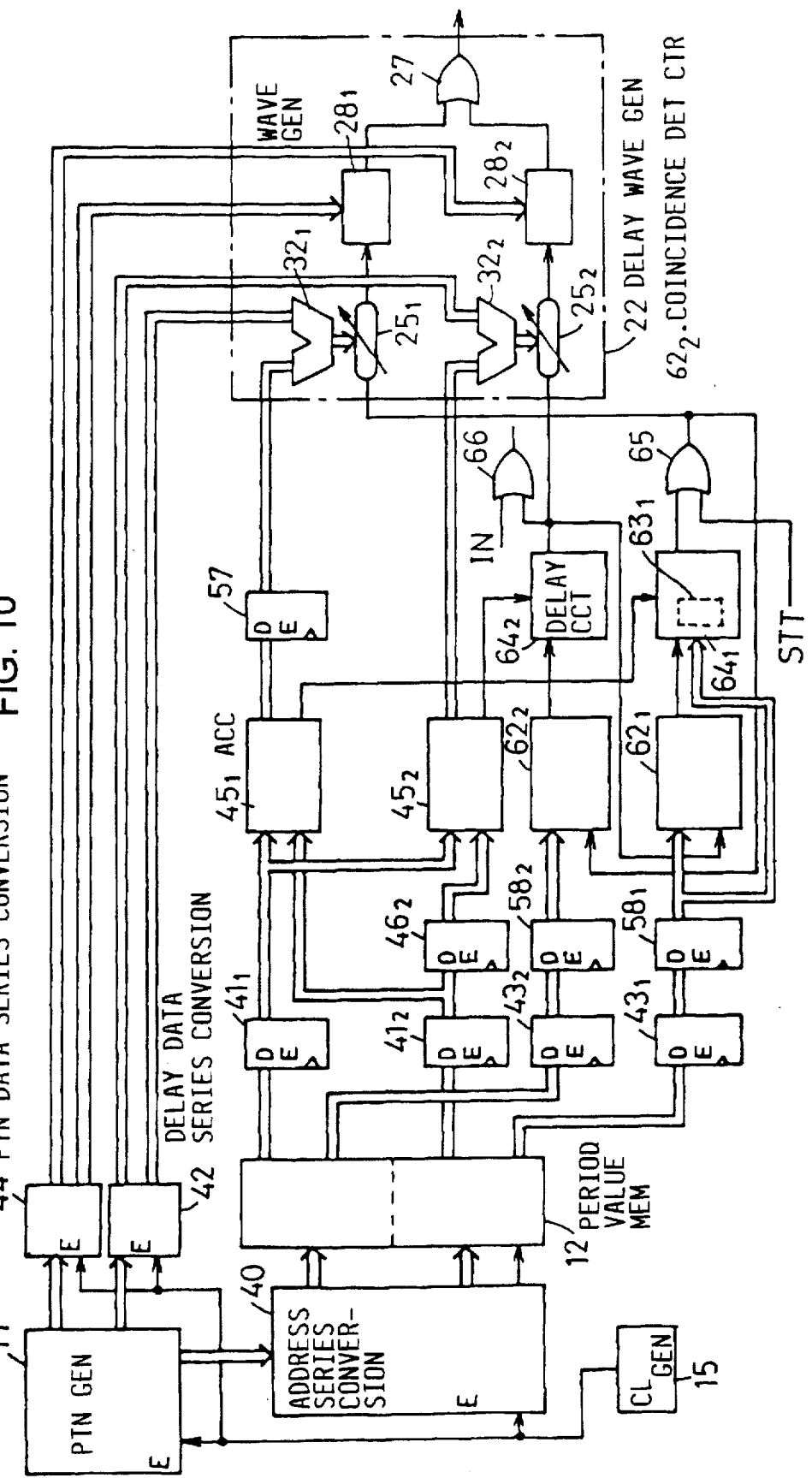
FIG. 10 is a block diagram showing an embodiment to which the present invention is applied, wherein the delayed waveform generator is arranged in two lines.

FIG. 10 shows an example of the present invention wherein two series of the delayed waveform generators 22 of FIG. 1 are provided. The same reference symbols are assigned to the portions corresponding to those in FIG. 5. In this case, a delay data series having clock period from the pattern generator 11 is split into two series by delay data series conversion means 42 such that each period is doubled. This conversion could be achieved by a method similar to the address series conversion means 40. Similarly, a pattern data series from the pattern generator 11 is split into two series each of which has two time periods by pattern data series conversion means 44. The two delay data series from the delay data series conversion means 42 are added to the output of the flip-flop 57 and the fraction output of the accumulator $45_2$ in the adders $32_1$ and $32_2$ respectively. The outputs of the adders $32_1$ and $32_2$ are set as the delay amounts for the delay elements $25_1$ and $25_2$ respectively. Based on the outputs of the delay elements $25_1$ and $25_2$, waveforms are generated respectively in the waveform generation parts $28_1$ and $28_2$ in accordance with the respective two pattern data series from the pattern data series conversion means 44. These generated waveform series are assembled and outputted by the OR circuit 27.

Figure 11:
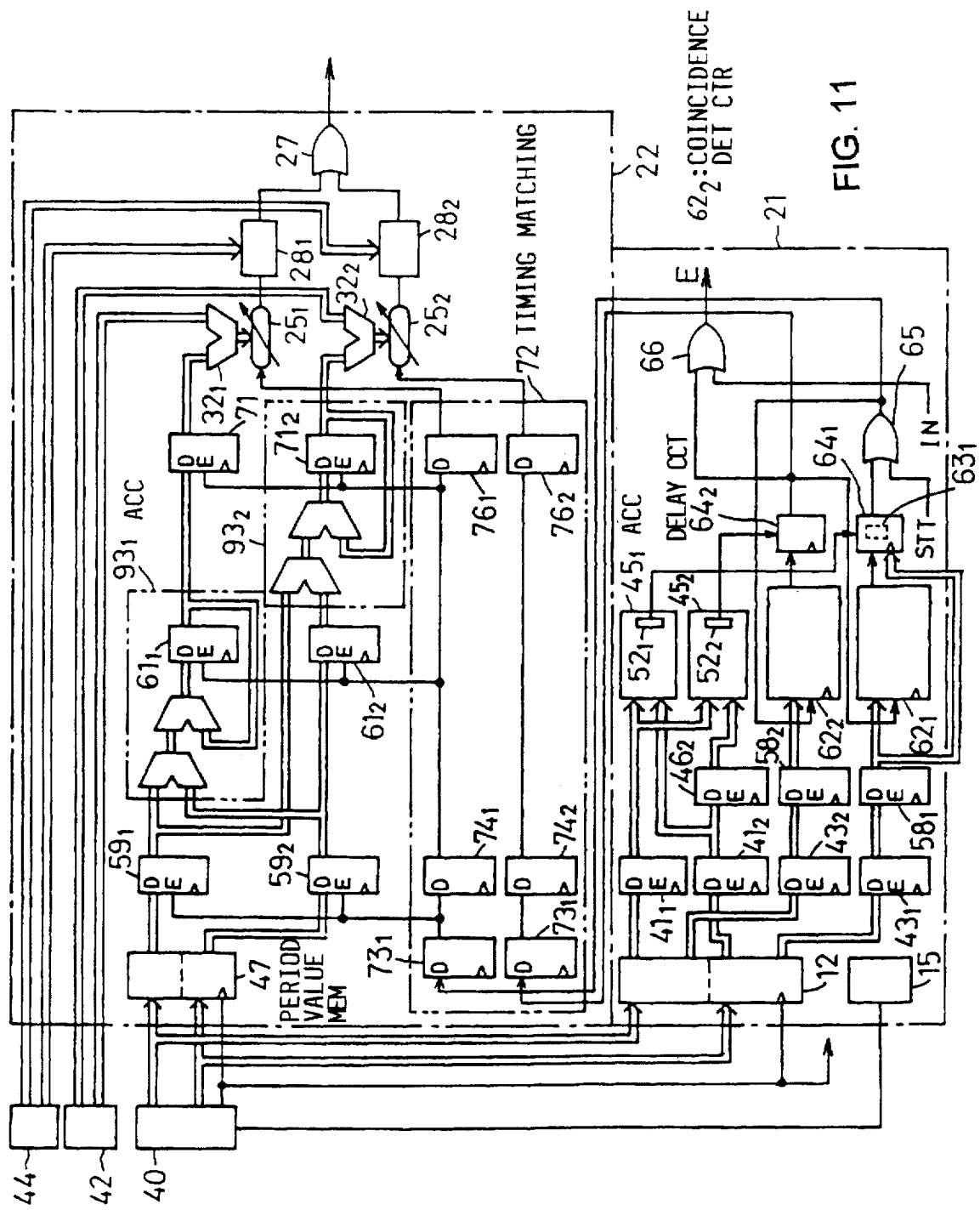
FIG. 11 is a block diagram showing an embodiment of the present invention wherein a fraction generation is performed in the delayed waveform generator in the embodiment of FIG. 10.

The period generator 21 and the delayed waveform generator 22 are sometimes installed apart relatively far each other. Generally each output fraction from the accumulators $45_1$, $45_2$, ... has relatively large number of digits. Comparing with this, the number of bits of the address for reading the period value memory 12 is sometimes less than that of the fraction. In such a case, the number of conductive wires of the signal transmission cable from the period generator 21 to the delayed waveform generator 22 could be reduced by an arrangement shown in FIG. 11. In FIG. 11, the same reference symbols are assigned to the portions corresponding to those in FIG. 10. A period value memory 47 is provided on the side of the delayed waveform generator 22 and the period value memory 47 is read out by the two address series from the address series conversion means 40. The storage contents of the period value memory 47 are selected such that the fractions $F_1$ and $F_2$ read out from the period value memory 47 are equal to the fractions $F_1$ and $F_2$ read out from the period value memory 12 respectively. The fractions $F_1$ and $F_2$ read out from the period value memory 47 are stored respectively in flip-flops (first stage flip-flops for the first and the second fractions for fraction detection) $59_1$ and $59_2$. The output of the flip-flop $59_2$ is stored in a flip-flop (second stage flip-flop for the second fraction for fraction detection) $61_2$. The outputs of the flip-flops $59_1$ and $59_2$ are summed and accumulated in a accumulator $93_1$, and the outputs of the flip-flops $59_1$ and $61_2$ are summed and accumulated in a accumulator $93_2$. The fraction values of the summed and accumulated results in the accumulators $93_1$ and $93_2$ only need to be equal to the fraction values of the summed and accumulated results in the accumulators $45_1$ and $45_2$ respectively, and thus the carry output is not necessary. That is, each summing accumulation may be performed in arbitrary sequence. The summed and accumulated result in the accumulator $93_1$ is supplied to a flip-flop 71 and a timing adjustment with the output of the accumulator $93_2$ is performed. In such a way, the same summed outputs as those of the accumulators $45_1$ and $45_2$ are obtained and are supplied to the adders $32_1$ and $32_2$ to be added to the two delay data series respectively.

Figure 13B:
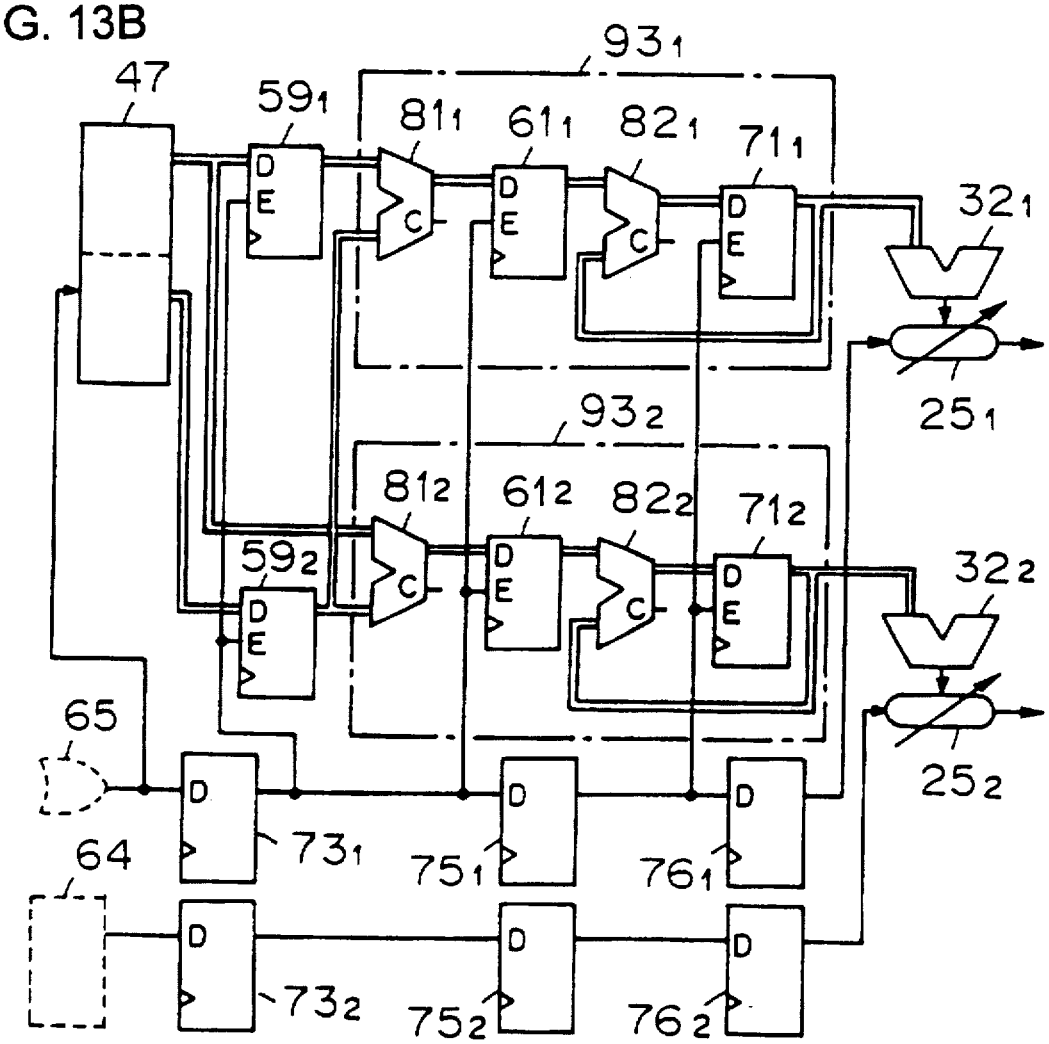
FIG. 13B is a block diagram showing another example of the delayed waveform generator 22 in FIG. 11.

On the other hand, in the accumulators $45_1$ and $45_2$ or the period generation apparatus 21, the fractions of the summed and accumulated results are not outputted but only carry outputs are outputted. These carry outputs are supplied to the delay circuits $64_1$ and $64_2$. The outputs of the OR circuit 65 and the delay circuit $64_2$ are timing matched in timing matching means 72 respectively with the timing from the period value memory 47 through outputting of the two series of summed and accumulated fraction values, and are then supplied to the delay elements $25_1$ and $25_2$ respectively. That is, the timing matching means 72 comprises two series of cascade stages of flip-flops $73_1$, $73_2$, $74_1$, $74_2$, $76_1$ and $76_2$ corresponding to the respective timing of, for example, reading of the period value memory 47, the flip-flops $59_1$, $59_2$, $61_1$, $61_2$, $71_1$ and $71_2$. The outputs of the flip-flops $73_1$ and $74_1$ enable the group of flip-flops $59_1$, $59_2$ and the group of accumulator $93_1$, flip-flop $61_2$, flip-flop 71, accumulator $93_2$ respectively. In the waveform generator 22 of FIG. 11, the accumulators $93_1$ and $93_2$ may be arranged similarly to the accumulators $45_1$ and $45_2$ in FIG. 5 respectively. Alternatively, as shown in FIG. 13B, the accumulator $93_1$ may be arranged such that the outputs of the flip-flops $59_1$ and $59_2$ are summed in an adder $81_1$, the output of the adder $81_1$ is supplied to an adder $81_2$ via the flip-flop $61_1$ to be added to the output of the flip-flop $71_1$, and the summed result is supplied to the flip-flop $71_1$. Also, the accumulator $93_2$ may be arranged such that the output F1 of the period value memory 47 and the output of the flip-flop $59_2$ are summed in an adder $81_2$, the summed result of the adder $81_2$ is supplied to an adder $82_2$ via the flip-flop $61_2$ to be added to the output of the flip-flop $71_2$, and the summed result is supplied to the flip-flop $71_2$. In this case, flip-flops $75_1$ and $75_2$ are interposed respectively between the flip-flops $73_1$, $73_2$ and the flip-flops $76_1$, $76_2$, and the output of the flip-flop $73_1$, is supplied not only to the enabling terminals E of the flip-flops $59_1$ and $59_2$ but also to the enabling terminals E of the flip-flops $61_1$, and $61_2$, and the output of the flip-flop $75_1$ is supplied to the enabling terminals E of the flip-flops $71_1$ and $71_2$. Each summing between the flip-flop $59_1$ and the flip-flop $61_1$ and between the flip-flop $61_1$ and the flip-flop $71_1$ is once, in this case, the adder design is simpler than the case of FIG. 11 where two summing operations are performed between the flip-flops $59_1$ and $61_1$.

Figure 14:
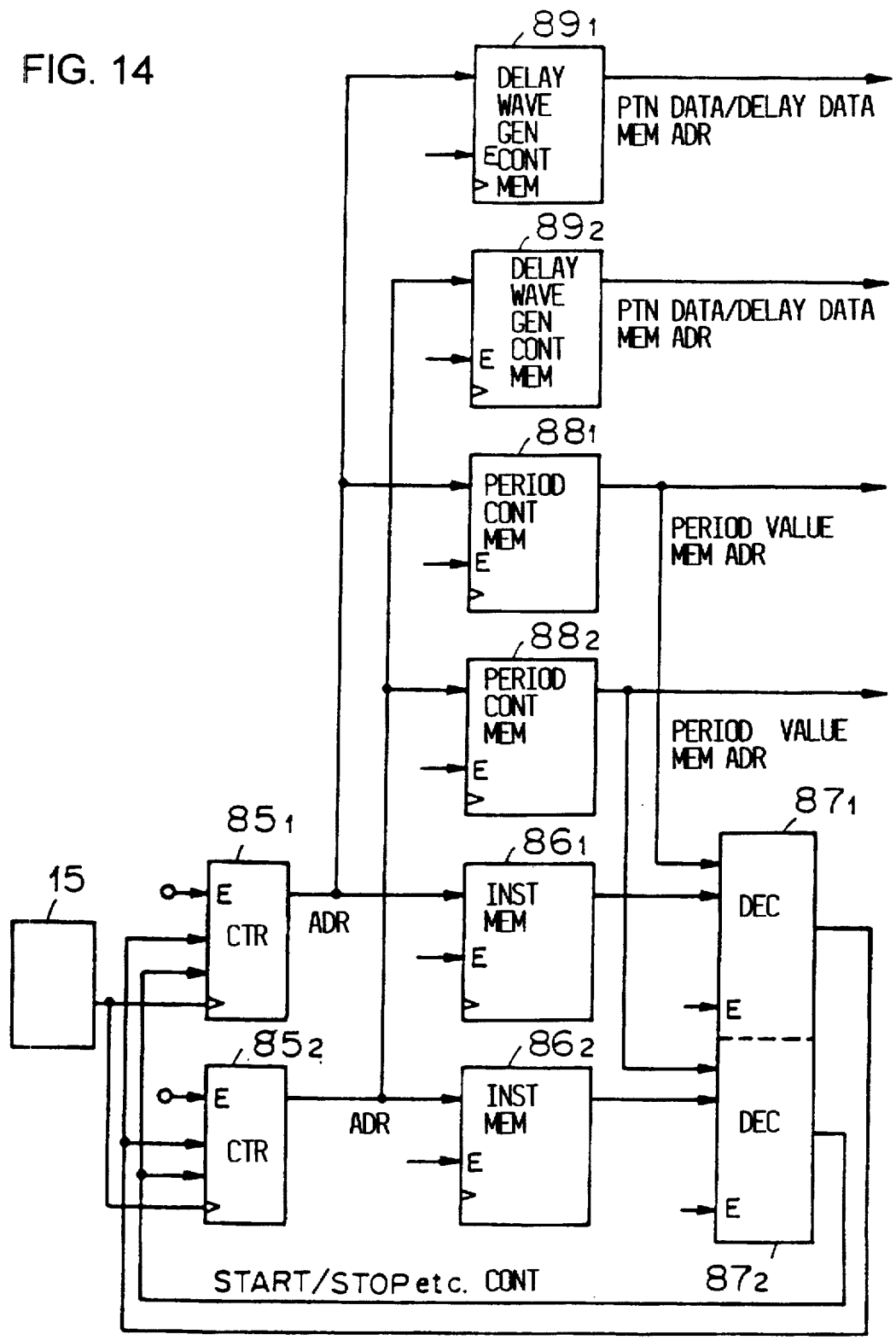
FIG. 14 is a block diagram showing an example of the pattern generator 11 for generating two series data.

In FIG. 10, each of the address data series, the delay data series and the pattern data series is converted into two data series. However, a certain pattern generator 11 itself generates two data series. FIG. 14 shows an outline of this arrangement example. That is, instruction memories $86_1$ and $86_2$ are read out by a first and a second addresses from address counters $85_1$ and $85_2$ respectively. The instructions read out from the instruction memories $86_1$ and $86_2$ are decoded by decoders $87_1$ and $87_2$ respectively. Increment, jump, halt and loop etc. in each of the address counters $85_1$ and $85_2$ are controlled by the decoded result. Period control memories $88_1$ and $88_2$, and delayed waveform generation control memories $89_1$ and $89_2$ are read out by the first and second addresses from the address counters $85_1$ and $85_2$ respectively. The period value memory 47 in FIG. 10 is read out by the first and second period memory addresses read out from the period control memories $88_1$ and $88_2$ respectively. Although not shown in the above description, a delay data memory and a pattern data memory are provided in the delayed waveform generator 22 similarly to the period value memory 12 in the period generation apparatus 21. These delay data memory and pattern data memory are read out respectively by each delay data memory address and each pattern data memory address read out from the respective delayed waveform generation control memories $89_1$ and $89_2$. Each delay data read out from the delay data memory is supplied to the adders $32_1$ and $32_2$ respectively, and each pattern data read out from the pattern data memory is supplied to the waveform generation parts $28_1$ and $28_2$ respectively. Each part shown in FIG. 14 is enabled by the enabling output E in the period generator.

In FIGS. 10 and 11, the outputs of the delay elements $25_1$ and $25_2$ may be supplied directly to the OR circuit 27 to generate the waveform for the output of the OR circuit 27 in accordance with the pattern data of the clock period from the pattern generator 11. Further, the methods shown in FIGS. 10 and 11 could be applied not only to the two series processing but also to the cases of three or more series processing.

Figure 12:
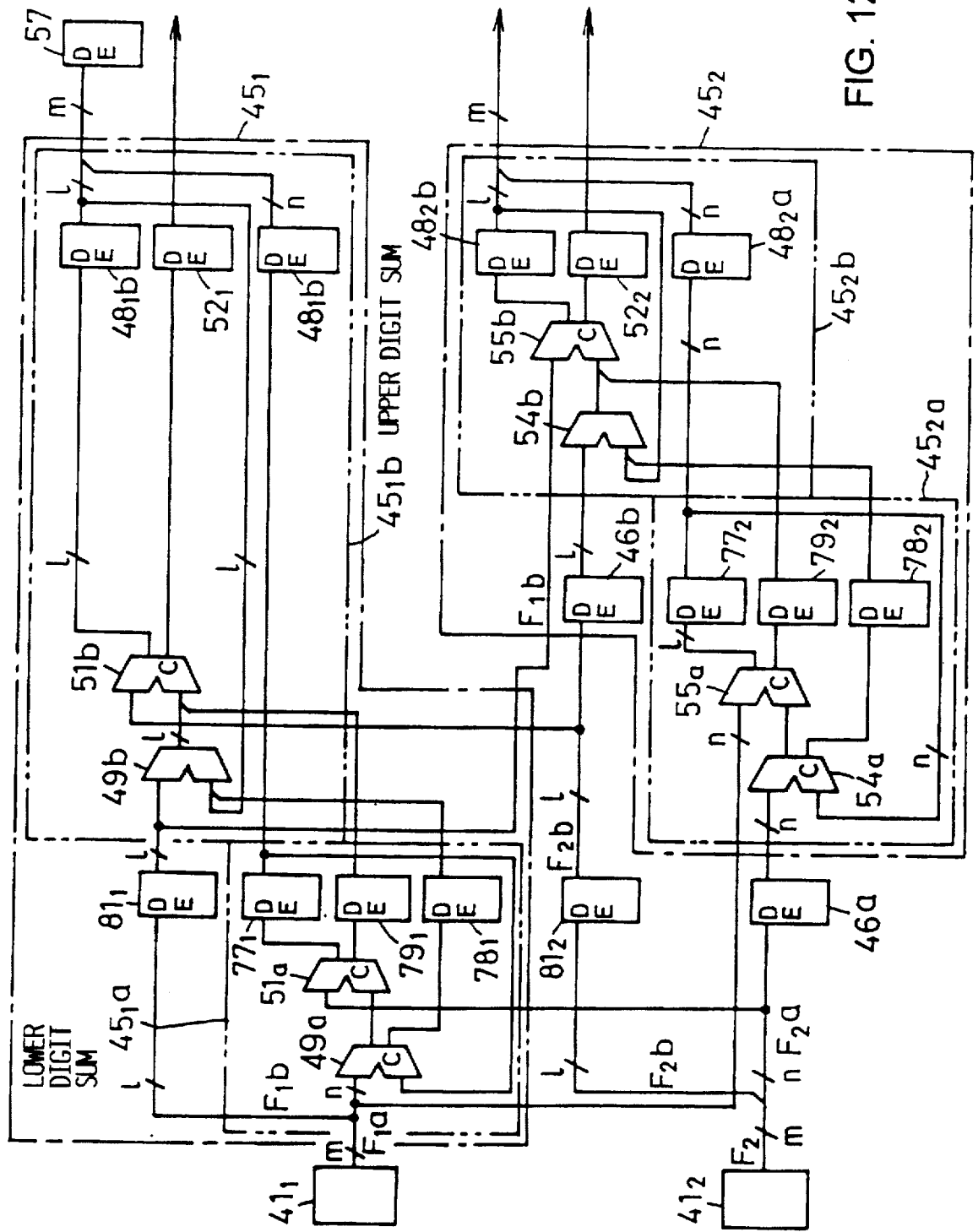
FIG. 12 is a block diagram showing an embodiment where the summing in the accumulator is performed in pipelined process.

When each fraction has large number of digits, a general purpose adder cannot be used. In such a case, a fraction is split into upper digit portion and lower digit portion and these upper and lower digit portions may be pipelined. FIG. 12 shows this example. That is, a lower digit portion $F_1a$ of a fraction $F_1$ from the flip-flop $41_1$ and a lower digit portion $F_2a$ of a fraction $F_2$ from the flip-flop $41_2$ are summed and accumulated in a lower digit summing part $45_1a$. The carry outputs of adders 49 a and 51 a are stored in the flip-flops $78_1$ and $79_1$ respectively. An upper digit portion $F_1b$ of the fraction $F_1$ and an upper digit portion $F_2b$ of the fraction $F_2$ are timed with the flip-flops $81_1$ and $81_2$ respectively, and then summed and accumulated in an upper digit summing part $45_1b$. At this time, the carry outputs of the flip-flops $78_1$ and $79_1$ are summed respectively in the adders 49b and 51b. The fraction of the summed and accumulated result from a flip-flop $77_1$ of the lower digit summing part $45_1a$ is timed with the flip-flop $48_1a$. The fraction of the summed and accumulated result from a flip-flop $48_1b$ of the upper digit summing part $45_1b$ is added to the upper side of the output of the flip-flop $48_1a$ to rake the output of the accumulator $45_1$. The carry of the adder 51b of the upper digit summing part $45_1b$ is stored in a flip-flop $52_1$ as a carry output. similarly, in the accumulator $45_2$, the lower digit portion $F_2a$ and the upper digit portion $F_2b$ of the fraction $F_2$ from the flip-flop $41_2$ are timed with flip-flops 46a and $81_2$ respectively. The output $F_2a$ of the flip-flop 46a and the lower digit portion $F_1a$ from the flip-flop $41_1$ are summed and accumulated in the lower digit summing part $45_2a$. The upper digit portion $F_1b$ from the flip-flop $81_1$ and the upper digit portion $F_2b$ from the flip-flop $81_2$ timed with a flip-flop 46b are summed and accumulated in the upper digit summing part $45_2b$. At this time; the carry of the lower digit summing part $45_2a$ is also summed together. The fraction part of the summed and accumulated result of the lower digit summing part $45_2a$ is timed with a flip-flop $48_2a$. The fraction part of the summed and accumulated result of the upper digit summing part $45_2b$ is added to the upper side of the output of the flip-flop $48_2a$ to make the output of the accumulator $45_2$. In this case, the computation bit width of each adder can be reduced by a half from the case of FIG. 5. Thus, a high speed computation is possible. The number of commutation stages between the flip-flop $41_1$ through the flip-flop 57 is double of the case of FIG. 5. However, as mentioned above, the data rate obtained at the flip-flop 57 is higher than the case of FIG. 5 because of the pipeline operations.

As mentioned above, according to the present invention, each of the summing accumulation of the fractions and the period generation of the integers are performed in n series. Therefore, the process in each series can take n time longer time than the conventional case. Consequently, low cost components can be used for generating high speed period signals.

In the examples up to FIG. 10, the apparatus is arranged assuming that the depth of the period value memory 12 is large (number of periods to be changed is large). When the depth of the period value memory 12 is small and the number of bits of the fraction F of the period value is large (e.g. depth 2, fraction 10 bits), namely depth<number of bits of fraction, if the same period value memory 12 and the accumulators $45_1$ and $45_2$ as in the period generation apparatus 21 are provided in the delayed waveform generator 22, the number of conductive wires in the connecting cable between the period generation apparatus 21 and the delayed waveform generator 22 can be reduced. In this case, if the address of the period value memory 12 which the period generator 21 receives is also given to the delayed waveform generator 22, the delayed waveform generator 22 can generate the fraction data. Therefore, the same advantage as in the aforementioned cases can be obtained.

What is claimed is:

1. A period generator for generating a period set by an integer value the unit of which is one clock period and a fraction value relative to said integer value, said period generator comprising:

first stage flip-flops for the first through the n-th (n is an integer equal to or greater than 2) fractions supplied with said fraction;

second stage flip-flops for the second through the n-th fractions supplied with outputs of said first stage flip-flops for the second through the n-th fractions, respectively;

first accumulator for summing and accumulating the outputs of said first stage flip-flops for the first through the n-th fractions, said first accumulator adding the output of the first stage flip-flop for the n-th fraction at last, and outputting a value less than the clock period in the summed and accumulated result as the summed and accumulated result as well as outputting a carry of the last addition;

i-th accumulator (i=2, 3, . . . , n) for summing and accumulating the outputs of said first stage flip-flops for the first through the (i−1)th fractions and the outputs of said second stage flip-flops for the i-th through the n-th fractions, said i-th accumulator adding the output of the first stage flip-flop for the (i−1)th fraction at last, and outputting a value less than said clock period in the summed and accumulated result as the summed and accumulated result as well as outputting a carry of the last addition;

third stage flip-flop supplied with the summed and accumulated result of said first accumulator;

first stage flip-flops for the first through the n-th integers supplied with said integer value;

second stage flip-flops for the first through the n-th integers supplied with the outputs of said first stage flip-flops for the first through the n-th integers, respectively;

first through n-th coincidence detection counters supplied with the outputs of said second stage flip-flops for the first through the n-th integers, respectively, said first through the n-th coincidence detection counters starting to count the clock from the initial value thereof by an activation command and generating outputs when the counted value coincides with the corresponding input integer value;

first through n-th delay circuits supplied with the outputs of said first through n-th coincidence detection counters, respectively, said first through n-th delay circuits being controlled by carries of second through (n+1)th (n+1=1) accumulators respectively such that respective inputs thereto are delayed by one clock period and outputted when the corresponding carries exist, the respective inputs thereto are outputted without any delay when the corresponding carries do not exist, and the respective outputs thereof are supplied to the activation terminals of said second through (n+1)th coincidence detection counters, respectively;

first through n-th delay elements supplied with the outputs of said first through n-th delay circuits, respectively, and to which the outputs of said second through n-th accumulators and the output of said third stage flip-flop are given as the set delay amounts, respectively;

an OR circuit for assembling the outputs of said first through n-th delay elements;

means for enabling loading of data into each of said coincidence detection counters, each of said flip-flops, and said first through n-th accumulators by means of an output of the p-th delay circuit (p is any one of 1, 2, . . . n); and q-th delay adjusting means (q is any one of 1, 2, . . . n and q≠p) in said q-th delay circuit for delaying the control of the carry output of said accumulators by one enabling period when the output of the second stage flip-flop for the q-th integer is other than zero.

2. The period generator according to claim 1 wherein an address series having the same period as said enabling period from a pattern generator is converted into first through n-th address series each of which has the period n times as many as said enabling period by taking out addresses at every n address intervals;

each of first through n-th fractions and each of first through n-th integers are read out from a period value memory at every n enabling periods by those converted first through n-th address series, and are stored in said first stage flip-flops for first through n-th fractions and in said first stage flip-flops for first through n-th integers, respectively;

a delay data series having enabling period from the pattern generator for determining the phases of the generated patterns is converted into first through n-th delay data series having the period n times the enabling period by delay data series conversion means by taking out the delay data at every n delay data intervals; and these converted first through n-th delay data series are added respectively to the outputs of said first through n-th accumulators by respective first through n-th adders and the results are set respectively in said first through n-th delay elements as respective delay amounts.

3. The period generator according to claim 2 including:

pattern data series conversion means for converting a pattern data series having the same period as said enabling period from said pattern generator into first through n-th pattern data series each having the period n times said enabling period by taking out pattern data at every n pattern data intervals; and first through n-th waveform generating means interposed between the side of said first through n-th delay elements and said OR circuit, respectively, where said first through n-th pattern data series are set respectively for converting the input pulses into waveforms corresponding to the respective set pattern data.

4. The period generation apparatus according to claim 1 wherein each of said accumulators comprises a lower digit summing part or receiving lower digit portions of the input and for summing and accumulating these lower digit portions, a carry part of said lower digit summing part, an upper digit summing part for receiving upper portions of the input and for summing and accumulating these upper digit portions, and means for outputting an output as the summed and accumulated result by placing the summed and accumulated value of said upper digit summing part less than one clock period to the upper digit side of the summed and accumulated result of said lower digit summing part less than one clock period.

5. A period generator for generating a period set by an integer value the unit of which is one clock period and a fraction value relative to said integer value, said period generator comprising:

address series conversion means for converting an address series having the same period as enabling period from a pattern generator into first through n-th address series each of which has the period n times (n is an integer equal to or greater than 2) said enabling period by taking out addresses at every n address intervals;

a first period value memory read out at every n enabling periods by said converted first through n-th address series;

first stage flip-flops for first through n-th fractions for carry detection for storing therein the first through n-th fractions read out from said first period value memory, respectively;

first stage flip-flops for first through n-th integers for storing therein the first through n-th integers read out from said first period value memory, respectively;

second stage flip-flops for the second through n-th fractions for carry detection supplied with the outputs of said first stage flip-flops for the second through n-th fractions for carry detection, respectively;

a first accumulator for carry detection for summing and accumulating the outputs of said first stage flip-flops for first through n-th fractions for carry detection using said enabling period as the unit, said first accumulator adding the output of the first stage flip-flop for the n-th fraction at last, and outputting a carry of said last addition;

i-th accumulator (i=2, 3, ..., n) for carry detection for summing and accumulating the outputs of said first stage flip-flops for the first through the (i−1)th fractions (i=2, 3, ..., n) and the outputs of said second stage flip-flops for the i-th through the n-th fractions for carry detection using said enabling period as the unit (once for every enabling period), said i-th accumulator adding the output of the first stage flip-flop for the (i−1)th fraction for carry detection at last, and outputting a carry of the last addition;

second stage flip-flops for first through n-th integers supplied with the outputs of said first stage flip-flops for the first through n-th integers, respectively;

first through n-th coincidence detection counters supplied with the outputs of said second stage flip-flops for the first through n-th integers, respectively, said first through n-th coincidence detection counters starting to count the clock from the inertial value thereof by an activation command and generating outputs when the counted value coincides with the corresponding input integer value;

first through n-th delay circuits supplied with the outputs of said first through n-th coincidence detection counters, respectively, said first through n-th delay circuits being controlled by carries of the second through (n+1)th (n+1=1) accumulators respectively such that respective inputs thereto are delayed by one clock period and outputted when the corresponding carries exist, the respective inputs thereto are outputted without any delay when the corresponding carries do not exist, and the respective outputs thereof are supplied to the activation terminals of said second through (n+1)th coincidence detection counters, respectively;

a second period value memory read out at every n enabling periods by said converted first through n-th address series;

first stage flip-flops for first through n-th fractions for fraction detection supplied with the first through n-th fractions read out from said second period value memory, respectively;

second stage flip-flops for fraction detection supplied with the outputs of said first stage flip-flops for the second through n-th fractions for fraction detection, respectively;

first accumulator for fraction detection for summing and accumulating the outputs of said first stage flip-flops for the first through the n-th fractions for fraction detection using said enabling period as the unit and for outputting a value less than said clock period in the summed result;

i-th accumulator for fraction detection for summing and accumulating the outputs of said first stage flip-flops for the first through the (i−1)th fractions for fraction detection and the outputs of said second stage flip-flops for the i-th through the n-th fractions for fraction detection using said enabling period as the unit and for outputting a value less than said clock period in the summed result;

a delay data series conversion means for converting a delay data series having the same period as said enabling period from said pattern generator into first through n-th delay data series each having the period n times said enabling period by taking oat delay data at every n delay data intervals;

first through n-th adders for adding said first through n-th delay data series to the outputs of said first through n-th accumulators, respectively;

a third flip-flop supplied with the added result of the first adder;

first through n-th timing means for providing to the outputs of said first through n-th delay circuits the delays corresponding to the delays from the time point of reading said second period value memory until outputs are obtained from said first through n-th accumulators for fraction detection;

first through n-th delay elements supplied with the outputs of said first through n-th timing means, respectively, and to which the outputs of the second through n-th adders and the output of said third stage flip-flop are given as the set delay amounts, respectively;

an OR circuit for assembling the outputs of said first through n-th delay elements;

means for enabling loading of data into each of said coincidence detection counters, each of said flip-flops, said first through n-th accumulators for carry detection, and said first through n-th accumulators for fraction detection by means of an output of the p-th delay circuit (p is any one of 1, 2, . . . n); and q-th delay adjusting means (q is any one of 1, 2, . . . n and q≠p) in said q-th delay circuit for delaying the control of the carry output of said accumulators by one enabling period when the output of the second stage flip-flop for the q-th integer is other than zero.

6. A period generator for generating a period set by an integer value the unit of which is one clock period and a fraction value relative to said integer value, said period generator comprising:

a period value memory read out at every n enabling periods (n is an integer equal to or greater than 2) by first through n-th address series from a pattern generator each having the period n times the enabling period;

first stage flip-flops for first through n-th fractions supplied with said first through n-th fractions read out from said period value memory, respectively;

second stage flip-flops for second through n-th fractions supplied with the outputs of said first stage flip-flops for second through n-th fractions, respectively;

first accumulator for summing and accumulating the outputs of said first stage flip-flops for said first through n-th fractions, said first accumulator adding the output of the first stage flip-flop for the n-th fraction at last, outputting a value less than the clock period in the summed and accumulated result as the summed and accumulated result, and outputting a carry of said last addition;

i-th accumulator for summing and accumulating the outputs of said first stage flip-flops for the first through (i−1)th fractions (i=2, 3, . . . , n) and the outputs of said second stage flip-flops for the i-th through n-th fractions, said i-th accumulator adding the output of said first stage flip-flop for the (i−1)th fraction at last, outputting a value less than said clock period in the summed and accumulated result as the summed and accumulated result, and outputting a carry of the last addition;

first through n-th adders for adding first through n-th delay data series from said pattern generator each having the period n times the enabling period to the outputs of said first through n-th accumulators, respectively;

a third stage flip-flop supplied with the summed and accumulated result of said first accumulator;

first stage flip-flops for first through n-th integers supplied with the first through n-th integer values read out from said period value memory, respectively;

second stage flip-flops for said first through n-th integers supplied with the outputs of said first stage flip-flops for the first through n-th integers, respectively;

first through n-th coincidence detection counters supplied with the outputs of said second stage flip-flops for the first through n-th integers, respectively, said first through n-th coincidence detection counters starting to count the clock from the initial value thereof by an activation command and generating outputs when the counted value coincides with the corresponding input integer value;

first through n-th delay circuits supplied with the outputs of said first through n-th coincidence detection counters, respectively, said first through n-th delay circuits are controlled by carries of said second through (n+1)th (n+1=1) accumulators respectively such that respective inputs thereto are delayed by one clock period and outputted when the corresponding carries exist, the respective inputs thereto are outputted without any delay when the corresponding carries do not exist, and the respective outputs thereof are supplied to the activation terminals of said second through (n+1)th coincidence detection counters, respectively;

first through n-th delay elements supplied with the outputs of said first through n-th delay circuits, respectively, and to which the outputs of said second through n-th adders and said third stage flip-flop are given as the set delay amounts, respectively;

an OR circuit for assembling the outputs of said first through n-th delay elements;

means for enabling loading of data into each of said coincidence detection counters, each of said flip-flops, and said first through n-th accumulators by means of an output of the p-th delay circuit (p is any one of 1, 2, . . . n); and q-th delay adjusting means (q is any one of 1, 2, . . . n and q≠p) in said q-th delay circuit for delaying the control of the carry output of said accumulators by one enabling period when the output of the second stage flip-flop for the q-th integer is other than zero.

7. The period generation apparatus according to claim 6 including:

first through n-th waveform generating means interposed between the output side of said first through n-th delay elements and said OR circuit respectively, where said first through n-th pattern data series having the period n times the enabling period from said pattern generator are set respectively for converting the input pulses into waveforms corresponding to the respective set pattern data.

8. A period generator for generating a period set by an integer value the unit of which is one clock period and a fraction value relative to said integer value, said period generator comprising:

a first period value memory read our at every n enabling periods (n is an integer equal to or greater than 2) by first through n-th address series from a pattern generator each having the period n times the enabling period;

first stage flip-flops for first through n-th fractions for carry detection for storing therein said first through n-th fractions read out from said first period value memory, respectively;

first stage flip-flops for first through n-th integers for storing therein said first through n-th integers read out from said first period value memory, respectively;

second stage flip-flops for second through n-th fractions for carry detection supplied with the outputs of said first stage flip-flops for the second through n-th fractions for carry detection, respectively;

first accumulator for carry detection for summing and accumulating the outputs of said first stage flip-flops for the first through n-th fractions for carry detection using said enabling period as the unit, said first accumulator adding the output of said first stage flip-flop for the n-th fraction at last, and outputting a carry of said last addition;

i-th accumulator for carry detection for summing and accumulating the outputs of said first stage flip-flops for the first through (i−1)th fractions for carry detection (i=2, 3, . . . , n) and the outputs of said second stage flip-flops for the i-th through n-th fractions for carry detection using said enabling period as the unit (once at every enabling period), said i-th accumulator adding the output of said first stage flip-flop for the (i−1)th fraction for carry detection at last, and outputting a carry of the last addition;

second stage flip-flops for the first through n-th integers supplied with the outputs of said first stage flip-flop for the first through n-th integers, respectively;

first through n-th coincidence detection counters supplied with the outputs of said second stage flip-flops for the first through n-th integers, respectively, said first through n-th coincidence detection counters starting to count the clock from the initial value thereof by an activation command and generating outputs when the counted value coincides with the corresponding input integer value;

first through n-th delay circuits supplied with the outputs of said first through n-th coincidence detection counters, respectively, said first through n-th delay circuits are controlled by carries of said second through (n+1)th (n+1=1) accumulators respectively such that respective inputs thereto are delayed by one clock period and outputted when the corresponding carries exist, the respective inputs thereto are outputted without any delay when the corresponding carries do not exist, and the respective outputs thereof are supplied to the activation terminals of said second through (n+1)th coincidence detection counters, respectively;

a second period value memory read out at every n enabling periods by said first through n-th address series;

first stage flip-flops for first through n-th fractions for fraction detection for storing therein said first through n-th fractions read out from said second period value memory, respectively;

second stage flip-flops for fraction detection supplied with the outputs of said first stage flip-flops for the second through n-th fractions for fraction detection, respectively;

first accumulator for fraction detection for summing and accumulating the outputs of said first stage flip-flops for the first through n-th fractions for fraction detection using said enabling period as the unit, and for outputting a value less than said clock period of the summed result;

i-th accumulator for fraction detection for summing and accumulating the outputs of said first stage flip-flops for the first through (i−1)th fractions for fraction detection and the outputs of said second stage flip-flops for the i-th through n-th fractions for fraction detection using said enabling period as the unit, and for outputting a value less than said clock period of the summed result;

first through n-th adders for adding first through n-th delay data series from said pattern generator each having the period n times the enabling period to the outputs of said first through n-th accumulators for fraction detection, respectively;

third stage flip-flop supplied with the summed and accumulated result or said first accumulator;

first through n-th timing means for providing to the outputs of said first through n-th delay circuits the delays corresponding to the delays from the time point of reading said second period value memory until outputs are obtained from said first through n-th accumulators for fraction detection;

first through n-th delay elements supplied with the outputs of said first through n-th timing means, respectively, and to which the outputs of said second through n-th adders and said third stage flip-flop are given as the set delay amounts, respectively;

an OR circuit for assembling the outputs of said first through n-th delay elements;

means for enabling loading of data into each of said coincidence detection counters, each of said flip-flops, and said first through n-th accumulators by means of an output of the p-th delay circuit (p is any one of 1, 2, . . . n); and q-th delay adjusting means (q is any one of 1, 2, . . . n and q≠p) in said q-th delay circuit for delaying the control of the carry output of said accumulators by one enabling period when the output of the second stage flip-flop for the q-th integer is other than zero.

* * * * *

UNITED STATES PATENT AND TRADEMARK OFFICE
CERTIFICATE OF CORRECTION

PATENT NO. : 5,761,100

DATED : June 2, 1998

INVENTOR(S) : Itoh et al.

It is certified that error appears in the above-identified patent and that said Letters Patent is hereby corrected as shown below:

Col. 2, line 14, "R-D" should be --RMD--;
line 25, "timer" should be --time,--.

Col. 3, line 67, "Into" should be --into--.

Col. 4, line 25, "in" should be --In--.

Col. 6, line 20, "$54_1$" should be --54,--;
line 43, "Dart" should be --part--.

Col. 7, line 19, "CR" should be --CK--;
line 47, "412" should be --$41_2$--.

Col. 8, line 4, "in" should be --In--;
line 36, "$5_{21}$" should be --$52_1$--.

Col. 9, line 16, "in" should be --In--;
line 17, "5 s" should be --5s--;
line 21, "52," should be --52 --.

Col. 11, line 6, "$(62_n1)$" should be --$(62_{n+1})$--;
line 45 "$25_1$" should be --$25_1$.--.

UNITED STATES PATENT AND TRADEMARK OFFICE
CERTIFICATE OF CORRECTION

PATENT NO. : 5,761,100
DATED : June 2, 1998
INVENTOR(S) : Itoh et al.

It is certified that error appears in the above-identified patent and that said Letters Patent is hereby corrected as shown below:

Col. 13, line 53, "in" should be --In--.
Col. 14, line 36, "49 a and 51 a" should be --49a and 51a--;
line 48, "rake" should be --make--;
line 51, start a NEW PARAGRAPH and change "similarly," to --Similarly,--;
line 60, "time;" should be --time,--.
Col. 18, line 5, "inertial" should be --initial--;
line 51, "oat" should be --out--.
Col. 20, line 48, "our" should be --out--.

Signed and Sealed this

Nineteenth Day of January, 1999

Attest:

*Acting Commissioner of Patents and Trademarks*

Attesting Officer